US009892794B2

(12) United States Patent
Micheloni et al.

(10) Patent No.: US 9,892,794 B2
(45) Date of Patent: Feb. 13, 2018

(54) METHOD AND APPARATUS WITH PROGRAM SUSPEND USING TEST MODE

(71) Applicant: IP GEM GROUP, LLC, Irvine, CA (US)

(72) Inventors: Rino Micheloni, Turate (IT); Antonio Aldarese, Vimercate (IT); Salvatrice Scommegna, Cornate D'Adda (IT)

(73) Assignee: IP GEM GROUP, LLC, Irvine, CA (US)

( * ) Notice: Subject to any disclaimer, the term of this patent is extended or adjusted under 35 U.S.C. 154(b) by 0 days.

(21) Appl. No.: 15/396,721

(22) Filed: Jan. 2, 2017

(65) Prior Publication Data

US 2017/0194053 A1    Jul. 6, 2017

Related U.S. Application Data

(60) Provisional application No. 62/274,715, filed on Jan. 4, 2016.

(51) Int. Cl.
*G11C 16/04* (2006.01)
*G11C 16/14* (2006.01)
*G11C 16/26* (2006.01)
*G11C 5/00* (2006.01)

(52) U.S. Cl.
CPC ............. *G11C 16/14* (2013.01); *G11C 5/005* (2013.01); *G11C 16/0408* (2013.01); *G11C 16/0483* (2013.01); *G11C 16/26* (2013.01)

(58) Field of Classification Search
CPC ......... G11C 16/10; G11C 16/14; G11C 16/16; G11C 16/26; G11C 16/0408; G11C 29/5004; G11C 5/005

USPC ............ 365/185.17, 185.29, 185.18, 185.19, 365/185.22, 230.06
See application file for complete search history.

(56) References Cited

U.S. PATENT DOCUMENTS

| 815,137 | A | 3/1906 | Beecher |
|---|---|---|---|
| 5,615,235 | A | 3/1997 | Kakuishi et al. |
| 5,732,092 | A | 3/1998 | Shinohara |
| 5,822,244 | A | 10/1998 | Hansen et al. |
| 5,875,343 | A | 2/1999 | Binford et al. |
| 6,115,788 | A | 9/2000 | Thowe |

(Continued)

OTHER PUBLICATIONS

NVM Express, revision 1.0; Intel Corporation;, Jul. 12, 2011, pp. 103-106 and 110-114;.

(Continued)

*Primary Examiner* — Gene Auduong
(74) *Attorney, Agent, or Firm* — Glass & Associates; Kenneth Glass

(57) ABSTRACT

A nonvolatile memory controller is disclosed that includes a read circuit configured to read memory cells of a nonvolatile memory device and a program and erase circuit configured to program and erase memory cells of the nonvolatile memory device. The nonvolatile memory controller includes a NAND shared algorithm circuit configured to communicate with the nonvolatile memory device so as to enter a test mode of the nonvolatile memory device and configured to modify the trim registers while the nonvolatile memory device is in the test mode such that the nonvolatile memory device performs one or more operations. The operations may include a suspendable program operation, a program suspend operation and an erase suspend operation.

20 Claims, 10 Drawing Sheets

(56) References Cited

U.S. PATENT DOCUMENTS

| | | |
|---|---|---|
| 6,148,360 A | 11/2000 | Leak et al. |
| 6,412,041 B1 | 6/2002 | Lee et al. |
| 6,539,515 B1 | 3/2003 | Gong |
| 6,567,313 B2 | 5/2003 | Tanaka et al. |
| 6,633,856 B2 | 10/2003 | Richardson et al. |
| 6,725,409 B1 | 4/2004 | Wolf |
| 6,789,227 B2 | 9/2004 | De Souza et al. |
| 6,871,168 B1 | 3/2005 | Tanaka et al. |
| 6,895,547 B2 | 5/2005 | Eleftheriou et al. |
| 6,934,804 B2 | 8/2005 | Hashemi |
| 6,963,507 B2 | 11/2005 | Tanaka et al. |
| 6,976,194 B2 | 12/2005 | Cypher |
| 6,976,197 B2 | 12/2005 | Faust et al. |
| 7,032,081 B1 | 4/2006 | Gefen et al. |
| 7,050,334 B2 | 5/2006 | Kim et al. |
| 7,116,732 B2 | 10/2006 | Worm et al. |
| 7,206,992 B2 | 4/2007 | Xin et al. |
| 7,209,527 B2 | 4/2007 | Smith et al. |
| 7,237,183 B2 | 6/2007 | Xin |
| 7,324,559 B2 | 1/2008 | McGibney |
| 7,376,015 B2 | 5/2008 | Tanaka et al. |
| 7,450,668 B2 | 11/2008 | Ghosh et al. |
| 7,457,906 B2 | 11/2008 | Pettey et al. |
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,620,784 B2 | 11/2009 | Panabaker et al. |
| 7,650,480 B2 | 1/2010 | Jiang et al. |
| 7,694,047 B1 | 4/2010 | Alston |
| 7,708,195 B2 | 5/2010 | Yoshida et al. |
| 7,739,472 B2 | 6/2010 | Guterman et al. |
| 7,752,346 B2 | 7/2010 | Talayco et al. |
| 7,801,233 B1 | 9/2010 | Chow et al. |
| 7,860,930 B2 | 12/2010 | Freimuth et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Maru |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang et al. |
| 8,244,946 B2 | 8/2012 | Gupta et al. |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,259,506 B1 | 9/2012 | Sommer et al. |
| 8,261,136 B2 | 9/2012 | D'Abreu et al. |
| 8,281,217 B2 | 10/2012 | Kim et al. |
| 8,281,227 B2 | 10/2012 | Inskeep et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,351,258 B1 | 1/2013 | Yang et al. |
| 8,359,522 B2 | 1/2013 | Gunnam et al. |
| 8,392,789 B2 | 3/2013 | Biscondi et al. |
| 8,402,201 B2 | 3/2013 | Strasser et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,473,812 B2 | 6/2013 | Ramamoorthy et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,638,602 B1 | 1/2014 | Horn et al. |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,706,956 B2 | 4/2014 | Cagno et al. |
| 8,707,122 B1 | 4/2014 | Micheloni et al. |
| 8,737,141 B2 | 5/2014 | Melik-Martirosian |
| 8,739,008 B2 | 5/2014 | Liu et al. |
| 8,755,229 B1 | 6/2014 | Visconti et al. |
| 8,762,620 B2 | 6/2014 | Prins et al. |
| 8,769,374 B2 | 7/2014 | Franceschini et al. |
| 8,775,913 B2 | 7/2014 | Haratsch et al. |
| 8,787,428 B2 | 7/2014 | Dai et al. |
| 8,856,622 B2 | 10/2014 | Ramamoorthy et al. |
| 8,898,372 B2 | 11/2014 | Yeh |
| 8,917,734 B1 | 12/2014 | Brown |
| 8,924,824 B1 | 12/2014 | Lu |
| 8,953,373 B1 | 2/2015 | Haratsch et al. |
| 8,958,247 B2 | 2/2015 | Asaoka et al. |
| 8,959,280 B2 | 2/2015 | Ma et al. |
| 8,984,216 B2 | 3/2015 | Fillingim |
| 8,995,197 B1 | 3/2015 | Steiner et al. |
| 8,995,302 B1 | 3/2015 | Brown et al. |
| 9,025,495 B1 | 5/2015 | Onufryk et al. |
| 9,058,289 B2 | 6/2015 | Tai et al. |
| 9,142,314 B2 | 9/2015 | Beltrami et al. |
| 9,164,891 B2 | 10/2015 | Karamcheti et al. |
| 9,244,763 B1 | 1/2016 | Kankani et al. |
| 9,251,909 B1 | 2/2016 | Camp et al. |
| 9,257,182 B2 * | 2/2016 | Grunzke ............ G11C 16/0483 |
| 9,294,132 B1 | 3/2016 | Peleato-Inarrea |
| 2002/0051501 A1 | 5/2002 | Demjanenko et al. |
| 2002/0129308 A1 | 9/2002 | Kinoshita et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0136236 A1 | 7/2004 | Cohen |
| 2004/0181735 A1 | 9/2004 | Xin |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0252791 A1 | 11/2005 | Pechtold et al. |
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0101225 A1 | 5/2007 | Moon et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |

(56) References Cited

U.S. PATENT DOCUMENTS

| | | |
|---|---|---|
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1 | 9/2012 | Melik-Martirosian et al. |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1 | 1/2013 | Livshitz et al. |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0029336 A1 | 1/2014 | Venkitachalam et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0164881 A1 | 6/2014 | Chen et al. |
| 2014/0181426 A1* | 6/2014 | Grunzke ............ G11C 16/0483 711/154 |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0281767 A1 | 9/2014 | Alhussien et al. |
| 2014/0281771 A1 | 9/2014 | Yoon et al. |
| 2014/0281808 A1* | 9/2014 | Lam .................... G06F 11/1048 714/764 |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1 | 5/2015 | Chen et al. |
| 2015/0131373 A1 | 5/2015 | Alhussien et al. |
| 2015/0149871 A1 | 5/2015 | Chen et al. |
| 2015/0169468 A1 | 6/2015 | Camp et al. |
| 2015/0186055 A1 | 7/2015 | Darragh |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1 | 2/2016 | Alrod et al. |
| 2016/0071601 A1 | 3/2016 | Shirakawa et al. |
| 2016/0155507 A1* | 6/2016 | Grunzke ............ G11C 16/0483 711/154 |
| 2016/0179406 A1 | 6/2016 | Gorobets et al. |
| 2016/0293259 A1 | 10/2016 | Kim et al. |
| 2017/0213597 A1* | 7/2017 | Micheloni ............... G11C 16/14 |

OTHER PUBLICATIONS

NVM Express, Revision 1.0; Intel Corporation, Mar. 1, 2011, pp. 1-122.

RapidIO, PCI Express, and Gigabit Ethernet Comparison: Pros and Cons of Using Three Interconnects in Embedded Systems; RapidIO Trade Association, Technical White Paper, Revision 03,, May 2005, pp. 1-36.

PCI Express Base Specification Revision 3.0 (PCI Express Base Expression, PCISIG, hereinafter "PCIExpress"), Nov. 10, 2010, pp. 1-860.

RFC 793: Transmission Control Protocol, RFC 793, University of Southern California, IETF,, Sep. 1981, pp. 1-89.

Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.

Chen, et al., "Increasing flash memory lifetime by dynamic voltage allocation for constant mutual information", 2014 Information Theory and Applications Workshop (ITA), 2014, pp. 1-5.

Peleato, et al., "Probabilistic graphical model for flash memory programming", Statistical Signal Processing Workshop (SSP), 2012 IEEE, 2012, pp. 1-4.

Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

\* cited by examiner

METHOD AND APPARATUS WITH PROGRAM SUSPEND USING TEST MODE

BACKGROUND

Especially in enterprise and datacenter applications, one of the key parameters of Solid State Drives (SSDs) is Quality of Service (QoS). QoS is the overall performance of a telephony or computer network, particularly the performance seen by the users of the network. To quantitatively measure quality of service, several related aspects of the network service are often considered, such, without limitation, as error rates, bit rate, throughput, transmission delay, availability and jitter.

An SSD includes a flash controller and NAND flash memories organized in "flash channels." SSDs are managed by hosts (i.e. CPU, PC, server, or OS, without limitation) and communication between the host and the SSD is based on read and write transactions. When the host sends a request, a timer is started in the host computer and the time that the SSD takes to service the request falls under the QoS umbrella of the network. For the host computer, there are two types of requests, read and write. A host read request is translated by the flash controller into the correct NAND physical address. The NAND performs the read operation and returns the page content to the flash controller that sends the read data to the host.

For a write request, the flash controller decides where to physically store the host's data inside the pool of available NAND memories, and then programs the host's data into the selected NAND memory. Because the NAND programming operation takes milliseconds, data to be written are cached inside a DRAM bank so that the time to service the host's request can be reduced. The biggest problem for QoS in the SSD context is read latency because it can't be masked by a simple caching technique.

One way to solve this problem is to suspend an ongoing programming or erase operation and resume the suspended operation at a later point in time.

Accordingly, there is a need for suspending both erase and program operations. Though some commercial NAND flash memories allow for erase suspend (e.g., using an Erase Suspend command), program suspend functionality has not been embedded in commercial NAND flash memories. The method and apparatus of the present invention allow for implementing a program suspend using commercially available NAND flash memories.

SUMMARY

A method is disclosed that includes initiating operation of a nonvolatile memory device that includes trim registers, a microcontroller and a NAND memory array, the microcontroller coupled to the trim registers and to the NAND memory array, the microcontroller operable in response to receiving read, program and erase commands from a nonvolatile memory controller to read, program and erase memory cells of the NAND memory array using values stored in the trim registers. In embodiments of the present invention the nonvolatile memory device is not capable of suspending program operations in response to receiving a conventional program suspend command. In particular, the microcontroller is not operable in response to receiving a program suspend command during programming of memory cells of the NAND memory array to suspend the programming using the values stored in the trim registers.

The method includes communicating with the nonvolatile memory device to enter a test mode of the nonvolatile memory device, reading from one or more of the trim registers of the nonvolatile memory device while the nonvolatile memory device is in the test mode and setting the values in one or more of the trim registers while the nonvolatile memory device is in the test mode. The reading and the setting the values in one or more of the trim registers perform one or more operations at the nonvolatile memory device. The one or more operations may include one or more of a suspendable program operation, a program suspend operation and an erase suspend operation.

A nonvolatile memory controller is disclosed that includes a read circuit configured to read memory cells of a nonvolatile memory device and a program and erase circuit configured to program and erase memory cells of the nonvolatile memory device. The nonvolatile memory controller includes a NAND shared algorithm circuit configured to communicate with the nonvolatile memory device so as to enter a test mode of the nonvolatile memory device. The NAND shared algorithm circuit is configured to modify the trim registers of the nonvolatile memory device while the nonvolatile memory device is in the test mode such that the nonvolatile memory device performs one or more operations. The one or more operations may include a suspendable program operation, a program suspend operation and an erase suspend operation.

A nonvolatile memory system is disclosed that includes a nonvolatile memory device including trim registers, a microcontroller and a NAND memory array. The microcontroller is coupled to the trim registers and to the NAND memory array, and is operable in response to receiving read, program and erase commands to read, program and erase memory cells of the NAND memory array using values stored in the trim registers. The nonvolatile memory system includes a nonvolatile memory controller configured to communicate with the nonvolatile memory device so as to instruct the nonvolatile memory device to enter a test mode of the nonvolatile memory device and configured to modify one or more of the values stored in the trim registers of the nonvolatile memory device while the nonvolatile memory device is in the test mode. The nonvolatile memory device is operable upon receiving the modified trim register values to perform one or more operations indicated by the modified trim register values, at least one of the one or more operations selected from the group consisting of a suspendable program operation, a program suspend operation and an erase suspend operation.

BRIEF DESCRIPTION OF THE DRAWINGS

The accompanying drawings, which are incorporated in and form a part of this specification, illustrate various embodiments and, together with the Description of Embodiments, serve to explain principles discussed below. The drawings referred to in this brief description should not be understood as being drawn to scale unless specifically noted.

DETAILED DESCRIPTION OF THE INVENTION

Reference will now be made in detail to various embodiments, examples of which are illustrated in the accompanying drawings. While various embodiments are discussed herein, it will be understood that they are not intended to be limiting. On the contrary, the presented embodiments are intended to cover alternatives, modifications and equivalents, which may be included within the spirit and scope the various embodiments as defined by the appended claims. Furthermore, numerous specific details are set forth herein in order to provide a thorough understanding. However, embodiments may be practiced without one or more of these specific details. In other instances, well known methods, procedures, components, and circuits have not been described in detail as not to unnecessarily obscure aspects of the described embodiments. It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Figure 1:
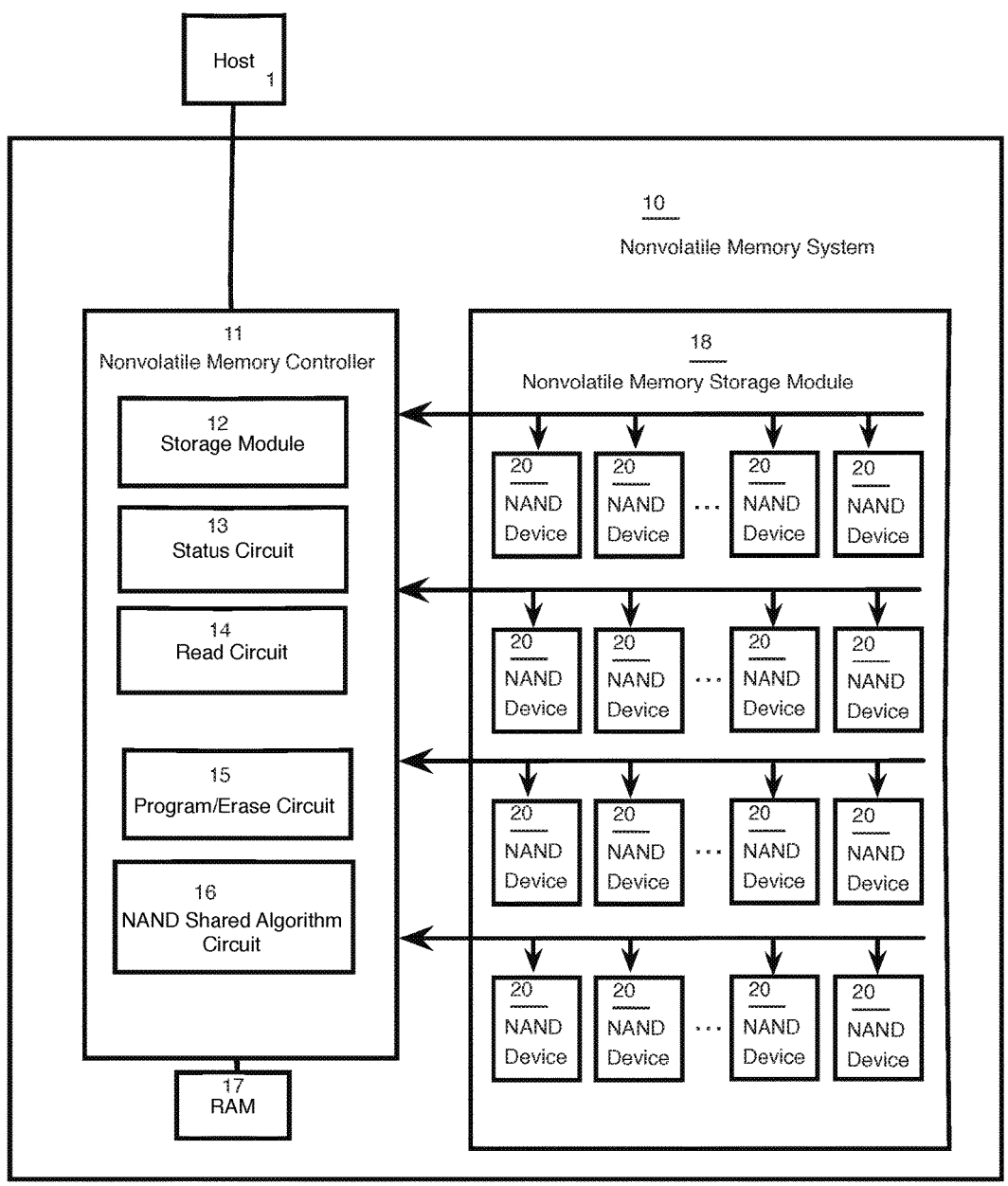
FIG. 1 is a block diagram illustrating a nonvolatile memory system that is connected to a host in accordance with an embodiment of the present invention.
Figure 2:
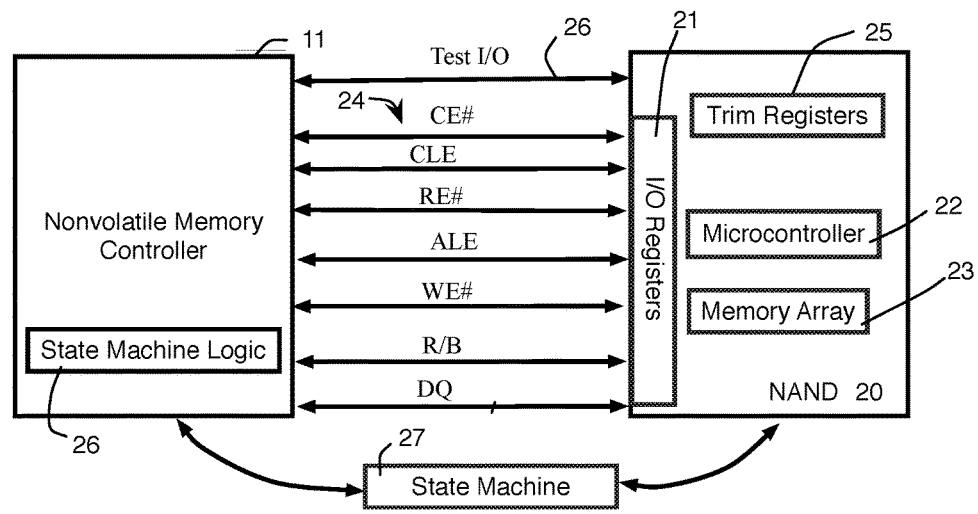
FIG. 2 is a diagram illustrating the connections between a nonvolatile memory controller and a NAND device in accordance with an embodiment of the present invention.

Nonvolatile memory system 10 of FIG. 1 includes a nonvolatile memory controller 11 in communication with a nonvolatile memory storage module 18 and a host computer 1. Nonvolatile memory controller 11 is coupled to random access memory (RAM 17) that may be, for example, DRAM. The nonvolatile memory storage module 18 includes a plurality of nonvolatile memory devices 20 for storing data. In the present embodiment, the nonvolatile memory devices 20 are NAND devices. Each nonvolatile memory device 20 may be a packaged semiconductor die that is coupled to nonvolatile memory controller 11 by conductive pathways that couple instructions, data and other information between each nonvolatile memory device 20 and nonvolatile memory controller 11. The conductive pathway between NAND devices 20 and the nonvolatile memory controller 11 may be referred to as a "flash channel," and may have the structure shown in FIG. 2.

Nonvolatile memory controller 11 is configured to perform program operations, read operations and erase operations on memory cells of nonvolatile memory devices 20 by sending program, erase and read commands to nonvolatile memory devices 20. Nonvolatile memory controller 11 includes a storage module 12, a status circuit 13 and a read circuit 14. Storage module 12 is configured to store data needed for operation of nonvolatile memory controller 11.

Status circuit 13 is configured to determine usage characteristics of nonvolatile memory devices 20. The determined usage characteristics may be stored in memory storage on nonvolatile memory controller 11. Alternatively, the determined usage characteristics can be stored in one or more nonvolatile memory devices 20. The term "usage characteristic" as used herein is a value determined during usage of a nonvolatile memory device 20 that indicates the historical usage of the nonvolatile memory device 20 up to a particular point in time. In embodiments of the present invention memory cells are organized into blocks and pages, and status circuit 13 is operable to determine and store the number of program and erase cycles of each block of each nonvolatile memory device 20.

Read circuit 14 is configured to perform reads of the nonvolatile memory device 20 by sending a read command to the nonvolatile memory device 20, that is stored in I/O registers 21 of the nonvolatile memory device 20. Upon receiving the read command at I/O registers 21, nonvolatile memory device 20 is operable to perform the read and output the results of the read to particular I/O registers 21 that couple to DQ signal lines. Nonvolatile memory controller 11 is operable to receive the results of the read via the DQ signal lines and send the results of the read to host 1, responsive to a host read command. Program and erase circuit 15 is configured to program memory cells of nonvolatile memory devices 20 by sending a program command to the nonvolatile memory device 20 that is to be programmed, and is configured to erase memory cells of a nonvolatile memory device 20 by sending an erase command to the nonvolatile memory device 20 to be erased. Upon receiving the program command or the erase command at I/O registers 21, the nonvolatile memory device 20 is operable to perform the command.

As previously stated, each nonvolatile memory device 20 is a packaged semiconductor die that is coupled to nonvolatile memory controller 11 by conductive pathways that couple instructions, data and other information between each nonvolatile memory device 20 and nonvolatile memory controller 11. In the embodiment shown in FIG. 2 each nonvolatile memory device 20 is coupled to nonvolatile memory controller 11 by the following signal lines 24 that are used in the normal operating mode of the nonvolatile memory device: chip enable line (CE#), a command latch enable (CLE) line, a read enable signal line (RE#), an address latch enable (ALE) signal line, a write enable single line (WE#), a read/busy (RB) signal line and input and output (DQ) signal lines. Some of signal lines 24 couple directly to input and output (I/O) registers 21 for coupling data between nonvolatile memory controller 11 and nonvolatile memory device 20 during normal operation of nonvolatile memory device 20.

Figure 3:
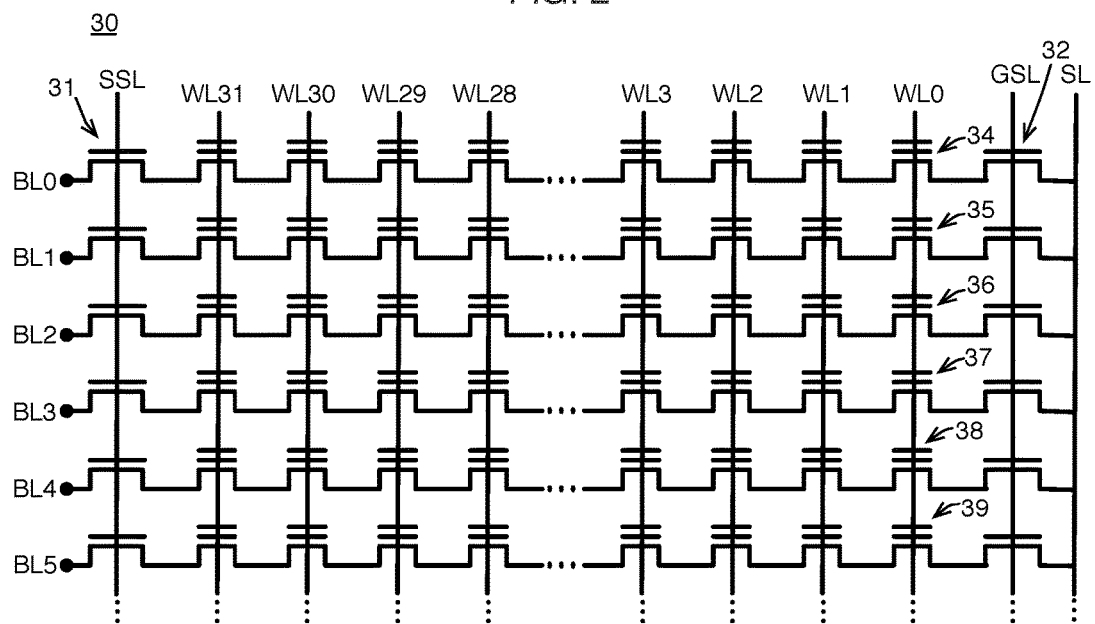
FIG. 3 is a diagram illustrating a NAND memory array in accordance with an embodiment of the present invention.

Each nonvolatile memory device 20 includes a microcontroller 22, memory array 23, trim registers 25 and I/O registers 21 that are electrically connected to microcontroller 22 and are embedded in nonvolatile memory device 20. Memory array 23 includes memory cells that may be single level cell (SLC) multi-level cell (MLC), triple-level cell (TLC) or quadruple-level cell (QLC) memory devices, without limitation. In one embodiment memory array 23 is made of memory cells connected in series to form NAND strings having the structure 30 shown in FIG. 3. Each NAND string is isolated from the rest of the array by select transistors, such as, for example, select transistor 31 and select transistor 32. Multiple memory cells share the gate voltage (Vg) through a word line, and the drain of one memory cell is the source of the adjacent one. For example, memory cells 34-39 of FIG. 3 share word line 0 (WL0).

Microcontroller 22 is in charge of managing all the internal operations, including programming, erasing and reading the memory cells of memory array 23. The registers of nonvolatile memory device 20 include I/O registers 21 and trim registers 25. I/O registers 21 are the registers accessible to external devices in the normal operating mode to couple data and instruction into and out of nonvolatile memory device 20. Trim registers 25 are internal registers that are not accessible by a user in the normal operating mode, some of which are used by microcontroller 22 to store trim values. NAND algorithms are complex and, therefore, it is necessary to keep them as flexible as possible, especially during product development. As such, a lot of trim registers 25 are used to store trim parameters. More particularly, once the product development is done, trim registers 25 are used during manufacturing to adjust algorithms to account for the unavoidable die-to-die variation that is typical for volume production. The term "trim registers" as used in the present application refers to those registers of a nonvolatile memory device 20 that are not accessible to the user in the normal operating mode of the nonvolatile memory device 20, but that are accessible in the test mode. Some trim registers 25 allow for loading instructions that are performed by microcontroller 22, and may be internal to microcontroller 22 or external to microcontroller 22. Different manufactures may have a different name for the mode that used to access internal registers. The term "test mode," as used in the present application, specifically includes any mode of operation that is used to access trim registers of a nonvolatile memory device 20 by other external devices. Trim registers 25 may include one or more register dedicated to test data input and output that is coupled directly to test I/O signal lines 26 and that couple to other internal trim registers.

NAND shared algorithm circuit 16 is coupled to storage module 12, status circuit 13, read circuit 14 and to program and erase circuit 15. NAND shared algorithm circuit 16 uses the flash channel to build a shared state machine 27 between nonvolatile memory device 20 and nonvolatile memory controller 11 by modifying the settings of trim registers 25 to perform one or more operations that are not supported by the normal operating mode of nonvolatile memory devices 20. Shared state machine 27 is different from the state machine incorporated into the nonvolatile memory device 20 (e.g., between the microcontroller 22 and the memory array 23) when it is initially manufactured and sold to the third-party responsible for incorporating it into a system and allows for operations that are more complex than the standard read, program and erase operations permitted by the nonvolatile memory device 20 hardware manufacturer that are programmed into nonvolatile memory device 20 when it is shipped to the customer.

NAND shared algorithm circuit 16 reads from and sets the values in trim registers 25 to modify how flash cells are read, programmed, and erased. In one embodiment, each NAND page is 16 kbyte long. From a physical standpoint, this translates into a matrix with 16*1024*8 bitlines. Each bitline is connected to a circuit called page buffer, or sense amplifier, which is in charge of translating the analog information stored inside a memory cell into a digital value. Inside the page buffer there are multiple latches, which are used to store the page after reading or before writing. Because of multilevel storage (e.g., TLC with 3 bits per cell) and cache operations, each page buffer contains a large number of latches (close to 10 in some cases). Therefore, by sending the appropriate commands to the microcontroller 22, NAND shared algorithm circuit 16 can take a page stored in one latch (there is one for each cell) and move it to another latch, thus freeing the latch. NAND shared algorithm circuit 16 takes advantage of this ability to "move" data within nonvolatile memory device 20 by reading trim registers 25 and setting the values of trim registers 25 to perform one or more page transfers within nonvolatile memory device 20. Reading trim registers and setting trim registers may involve transferring data between nonvolatile memory device 20 and nonvolatile memory controller 11 exclusively through test I/O signal lines 26. Alternatively, one or more signals may be coupled over signal lines 24, and some loading of data and instructions to trim registers 25, and corresponding output may be through other signal lines 24 (e.g., DQ bus).

In embodiments of the present invention trim registers 25 are simple latches or flip-flops. If the number of registers is high enough in the type of nonvolatile memory device 20 being used, the registers may be organized in one or more small Random Access Memory (RAM) that is internal to nonvolatile memory device 20. In embodiments of the present invention there are a large number of parameters that are pre-configured die-by-die and stored in NAND blocks, such as, for example, the starting voltage of a programming operation. At boot, the content of these non-volatile NAND blocks are transferred to trim registers 25 (e.g., to the trim register RAM) such that they can be accessed faster. Some trim registers 25 (e.g., in the trim register RAM) include run-time parameters that are updated while NAND internal algorithms are running. An example of a trim register 25 that includes run-time parameter is the trim register that stores the number of applied program pulses. The pre-configured parameters stored in the NAND blocks (or in other non-volatile internal registers) are not altered when the trim registers are modified to perform one or more operation in accordance with embodiments of the present invention, just their copy in trim registers 25 (e.g., in the trim register RAM). Accordingly, the setting of trim registers as disclosed in the present invention will only affect the current operation and will not affect subsequent operations.

Nonvolatile memory device devices 20 program memory cells by applying a sequence of programming pulses to the addressed wordline that is to be programmed. The programming operation starts the programming pulses at a programming Voltage ($V_{SEL}$) equal to a predetermined starting program voltage ($V_{START}$) and applying a program pulse having the programming voltage $V_{SEL}$ to each cell to be programmed (e.g., all cells on a page). A program-verify operation is performed to determine whether or not all of the cells (e.g., all cells on a page) are programmed. The page-program-verify operation is determined to be successful if all cells to be programmed (e.g., all cells on a page) have reached a target threshold voltage (Vt). Subsequent program pulses are applied with increasing programming voltages $V_{SEL}$ until programming is successful on all the cells that are to be programmed. The voltage of each program pulse is incremented by a voltage increment ($\Delta$VPP) until either the programming is successful or the number of pulses has exceeded a pulse threshold in which the programming operation is stopped and is determined to fail. This programming process can be represented by a program staircase such as exemplary program staircase 40 shown in FIG. 4A.

As mentioned, the present invention enables functions that cannot be performed using the normal operating mode of nonvolatile memory device 20. Program suspend is a good example; this functionality is missing in 2D NAND Flash memories, but it is needed to achieve read latencies (QoS) of a few milliseconds. Though any number of different methodologies can be used by shared state machine 27 to add program suspend functionality, three exemplary embodiments are disclosed. In one embodiment NAND shared algorithm circuit 16 of the present invention uses a "slicing approach" to provide program suspend functionality. With this approach, a single program operation is sliced into different program slices. During each program slice, suspend is not allowed. After performing each program slice, NAND shared algorithm circuit 16 performs any pending read operations and then accesses the nonvolatile memory device 20 being programmed and sets one or more of trim registers 25 to the values that are required to perform the next program slice.

Figure 4A:
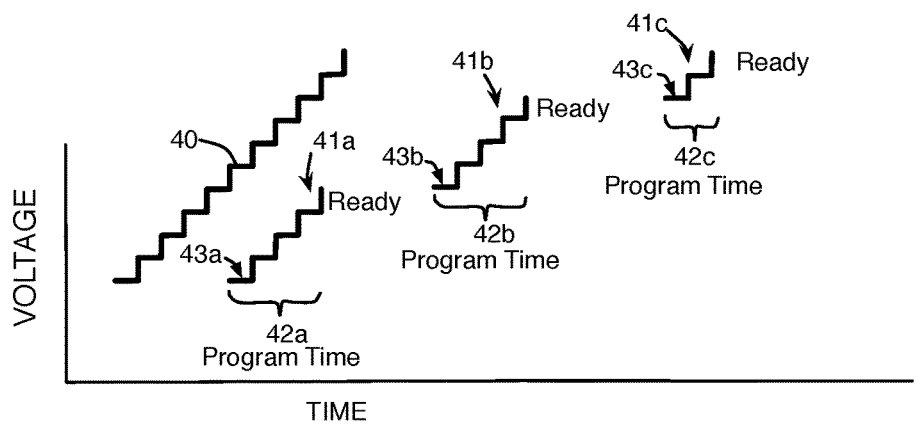
FIG. 4A is a diagram showing voltage versus time, and illustrates an exemplary suspendable program operation of a nonvolatile memory device using a slicing approach in accordance with an embodiment of the present invention.

In the exemplary embodiment shown in FIG. 4A the program operation represented by programming staircase 40 is sliced into exemplary program slices 41a, 41b and 41c. It is appreciated that program staircase 40 may be sliced into more program slices than are shown in FIG. 4A, and that some or all of program slices 41a-41c may have an equal number of program steps. In embodiments of the present invention the number of program steps in each program slice 41a-41c is set to make sure that the program time (42a, 42b and 42c) is short enough for nonvolatile memory system 10 to hit the QoS target.

Figure 4B:
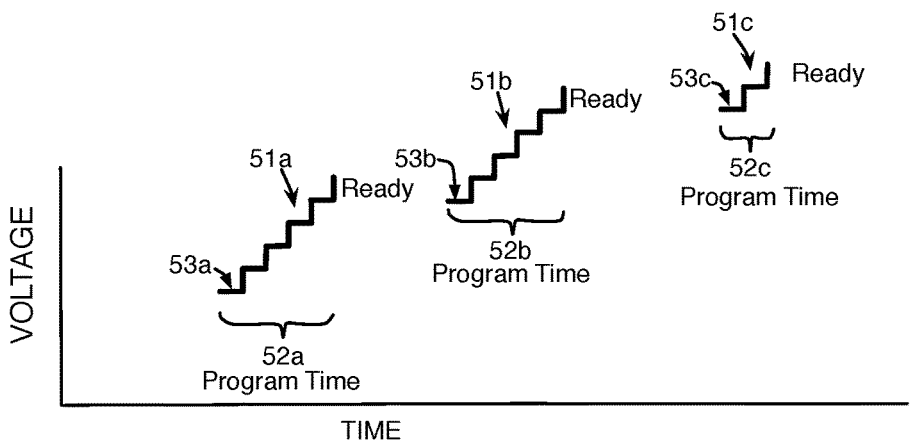
FIG. 4B is a diagram showing voltage versus time, and illustrates an exemplary suspendable program operation of a nonvolatile memory device using a slicing approach, and in which the last program step performed by each program slice is repeated in accordance with an embodiment of the present invention.

In one embodiment that is illustrated in FIG. 4B, at the start of each programming slice following the first program slice 51a (that starts at voltage 53a), the voltage $V_{SEL}$ of the last step of the previous program slice is repeated. More particularly, instead of beginning the second programming slice 51b at voltage 43b, program slice 51b starts at voltage 53b that is one step ($\Delta$VPP) lower than voltage 43b. Similarly, instead of beginning programming slice 51c at voltage 43c, program slice 51c starts at voltage 53c that is one step ($\Delta$VPP) lower than voltage 43c. In the present embodiment, this is accomplished by loading a value in one or more of trim registers 25 that indicates a programming step such that, in the next program slice, the last voltage step of the previous program slice will be repeated. It has been found that this results in a reduced raw Bit Error Rate (BER). This small trick allows for a trade-off between programming time and reliability, i.e. the number of available program/erase cycles.

Figure 6:
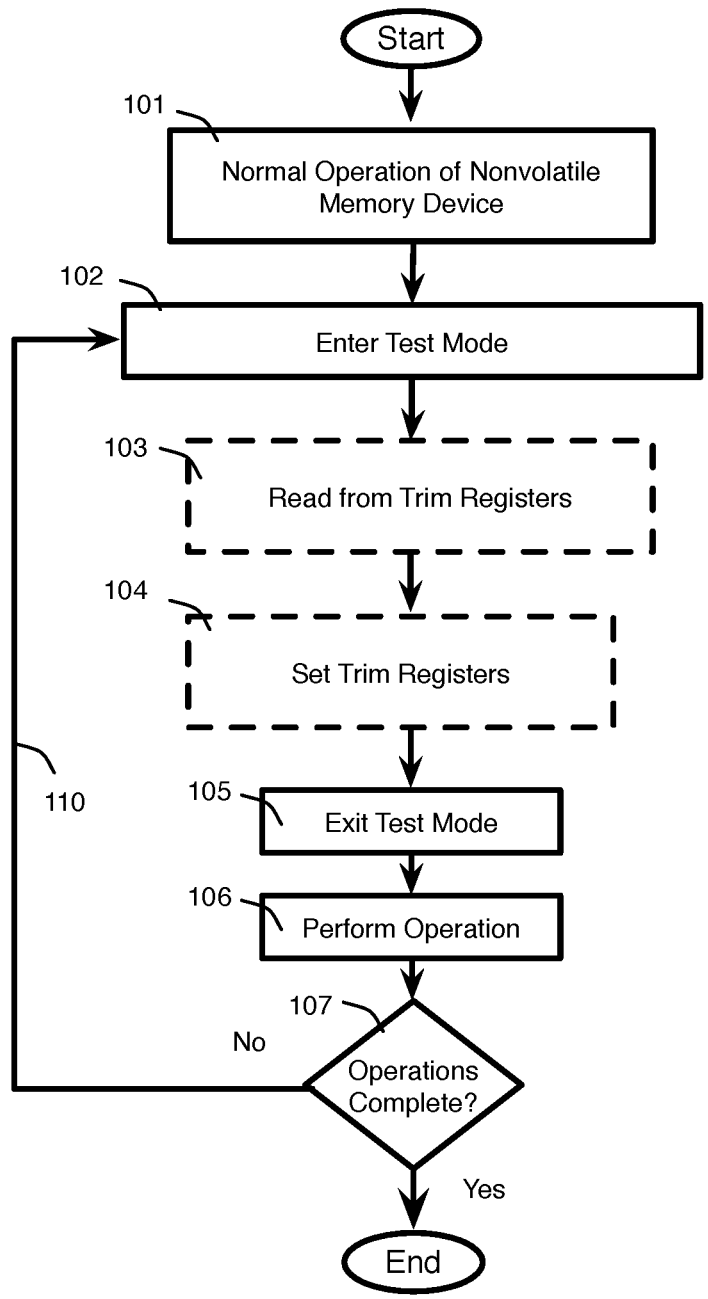
FIG. 6 is a flow diagram illustrating a method for performing operations using a nonvolatile memory device in which instructions are loaded into trim registers of the nonvolatile memory device in accordance with an embodiment of the present invention.

FIG. 6 illustrates a method 100 for performing operations using a nonvolatile memory device 20 that can be used to perform a suspendable program operation using the slicing approach. As shown by step 101 the method includes initiating normal operation of a nonvolatile memory device 20 that is coupled to a nonvolatile memory controller 11. Normal operation of nonvolatile memory device 20 includes receiving an instruction while not in the test mode, and programming memory cells (when the command is a program command), erasing memory cells (when the command is an erase command) or reading memory cells (when the command is a read command) in response to the received command. The term "normal operation," as used in the present invention, does not include any operations performed by a nonvolatile memory device 20 while the nonvolatile memory device 20 is in a test mode or performed as a result of an instruction loaded into trim register 25 while the nonvolatile memory device 20 is in the test mode.

In step 102, nonvolatile memory controller 11 communicates with nonvolatile memory device 20 to enter a test mode of the nonvolatile memory device 20. Depending on the vendor of nonvolatile memory device 20, entering the test mode may take 2, 3 or 4 command cycles (e.g., AAh, BBh, CCh), may take one or more address cycles and one or more data cycle (e.g., 01h, 02h may be used as a "confirm"). In one embodiment, a standard NAND protocol (ONFI or Toggle) is used with hexadecimal codes unique to the manufacturer of nonvolatile memory device 20.

In step 103, one or more trim registers 25 are read while the nonvolatile memory device 20 is in the test mode. In one exemplary embodiment eight trim registers 25 are addressed at a time (e.g., 1 byte) and the read sequence includes one or more command cycles to tell the nonvolatile memory device 20 that we want to read a register, one or more address cycles to address the target bank of trim registers 25 and a confirm command. The response from nonvolatile memory device 20 will be output of the content of the addressed trim registers 25.

In step 104, values in one or more of the trim registers 25 are set while the nonvolatile memory device 20 is in the test mode. Setting trim register values in step 104 modifies one or more of the values stored in the trim registers 25 to values that are different from the original values stored in the trim registers 25, that may be referred to as "modified trim register values." In one embodiment eight trim registers 25 are addressed at a time (e.g., 1 byte) to perform step 104. In the event that only one register needs to be modified, step 103 reads the eight bits, the bit corresponding to the register to be modified is changed and the eight bits are written back into the trim registers 25. In one embodiment, the read sequence includes one or more command cycles to tell the nonvolatile memory device 20 that we want to write a register, one or more address cycles to address the target bank of trim registers 25, data input and a confirm command. The response will be output of the content of the addressed trim registers 25.

In step 105, nonvolatile memory controller 11 communicates with nonvolatile memory device 20 such that nonvolatile memory device 20 exits the test mode. After exiting the test mode, the reading and the setting trim register values of steps 103-104 perform an operation as shown by step 106. Steps 102-106 may be repeated as shown by line 110 to perform additional operations at the nonvolatile memory device. In the present embodiment, at least one of the operations performed by steps 102-106 is not supported by the nonvolatile memory device 20 under normal operation. Though some operations will require both the reading of step 103 and setting trim register values of step 104 to be performed to complete the operation 106, some operations may only require the reading of step 103 and other operations may only require setting trim register values in step 104. At step 107, after all operations have been completed, the method ends.

In embodiments of the present invention in which the registers are organized in one or more small Random Access Memory (RAM) that is internal to nonvolatile memory device 20. In these embodiments, trim registers 25 are RAM trim registers, and the setting of step 104 sets one or more RAM trim register value such the pre-configured parameters stored in the NAND memory array (or in other non-volatile storage of nonvolatile memory device 20) are not altered by the setting trim registers in step 104, just their copy in RAM trim registers 25. Accordingly, the setting of trim registers in step 104 will only affect the current operation and will not affect subsequent operations.

When method 100 is used to perform a suspendable program operation, in a first iteration of steps 102-106, NAND shared algorithm circuit 16 sets trim registers 25 to apply the series of program pulses in the first slice 41a to the memory cells to be programmed. After performing first program slice 41a, when nonvolatile memory controller 11 has not received any pending read instructions for reading the memory cells of the nonvolatile memory device 20, the next program slice 41b is performed. When nonvolatile memory controller 11 has received one or more pending read instructions for reading the memory cells of the nonvolatile memory device 20 prior to the end of program slice 41a, NAND shared algorithm circuit 16 sets trim registers 25 to perform the pending read operations (e.g., subsequent iterations of steps 102-106) prior to performing the next program slice 41b. In a following iteration of steps 102-106, NAND shared algorithm circuit 16 sets trim registers 25 to apply the series of program pulses in the second slice 41b to the memory cells to be programmed. After performing the second program slice 41b, when nonvolatile memory controller 11 has not received any pending read instructions for reading the memory cells of the nonvolatile memory device 20, the next program slice 41c is performed. When nonvolatile memory controller 11 has received one or more pending read instructions for reading the memory cells of the nonvolatile memory device 20 prior to the end of program slice 41b, NAND shared algorithm circuit 16 sets trim registers 25 to perform the pending read operations (e.g., subsequent iterations of steps 102-106) prior to performing the next program slice 41c. In a following iteration of steps 102-106, NAND shared algorithm circuit 16 sets trim registers 25 to apply the series of program pulses in the third slice 41c to the memory cells to be programmed. It can be seen that each program slice is a series of programming steps that make up a portion of the overall programming operation, and that, once all program slices are completed, the entire program staircase 40 will have been performed.

Figure 7:
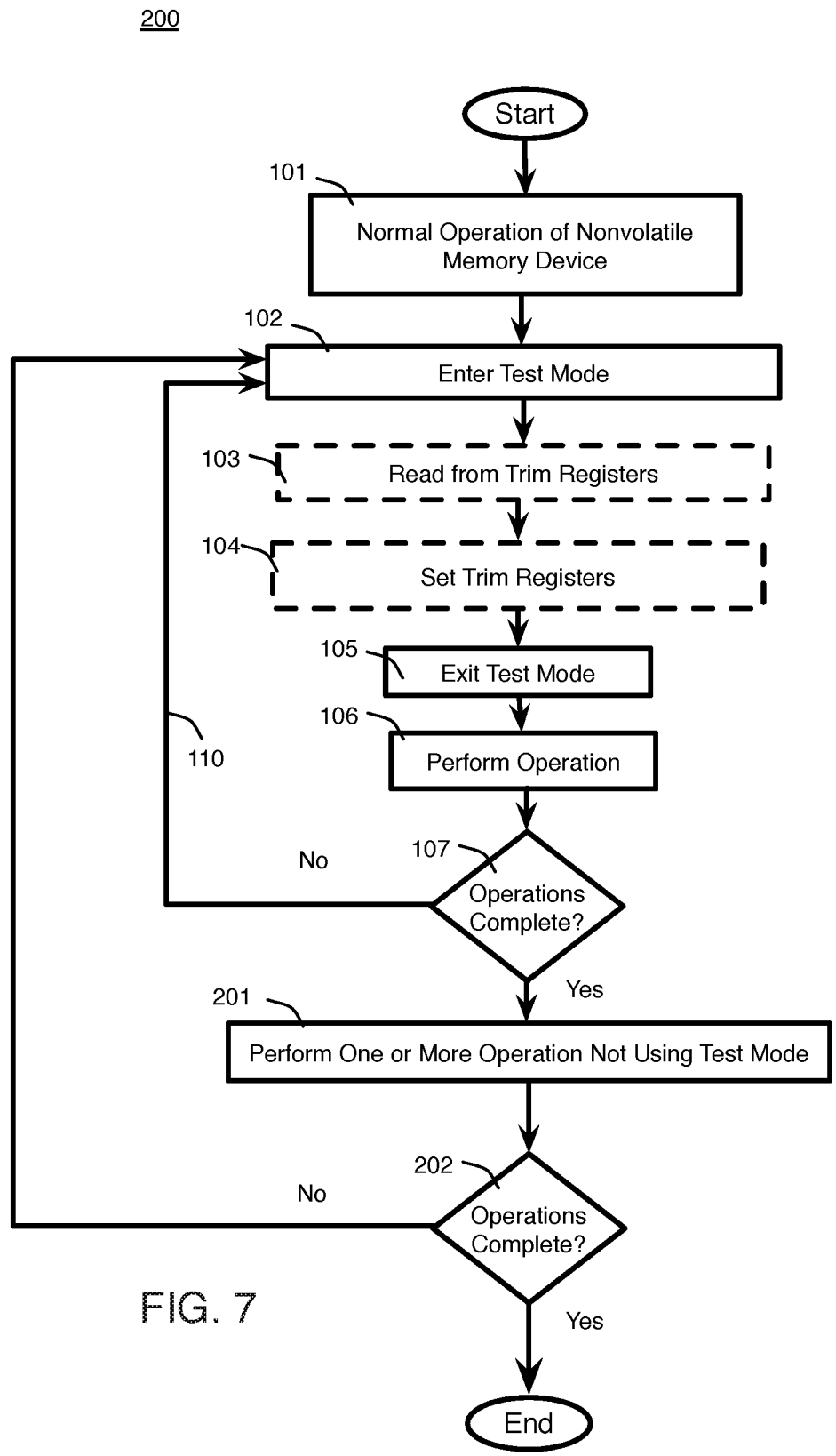
FIG. 7 is a flow diagram illustrating a method for performing operations using a nonvolatile memory device in which instructions are loaded into trim registers of a nonvolatile memory device and in which some operations are performed not using a test mode in accordance with an embodiment of the present invention.

In method 200 shown in FIG. 7 some of the operations are performed using the test mode and other operations are performed not using the test mode. More particularly, steps 102-106 are performed one or more time in order to perform one or more operations, and one or more operations are performed not using the test mode as shown by step 201. At step 202, after all operations have been completed, the method ends.

When method 200 is used to perform a suspendable program operation, a first iteration of steps 102-106 applies the series of program pulses in the first slice 41a to the memory cells to be programmed. If there is a pending read operation, in step 201 nonvolatile memory controller 11 sends a conventional read command to nonvolatile memory device 20, which is then operable to read the memory cells and output the results. A following iteration of steps 102-106 applies the series of program pulses in the second slice 41b to the memory cells to be programmed. If there is a pending read operation when program slice 41b finishes, in step 201 nonvolatile memory controller 11 sends a conventional read command to nonvolatile memory device 20, which is then operable to read the memory cells and output the results. The following iteration of steps 102-106 then applies the series of program pulses in the third slice 41c to the memory cells to be programmed.

Figure 8:
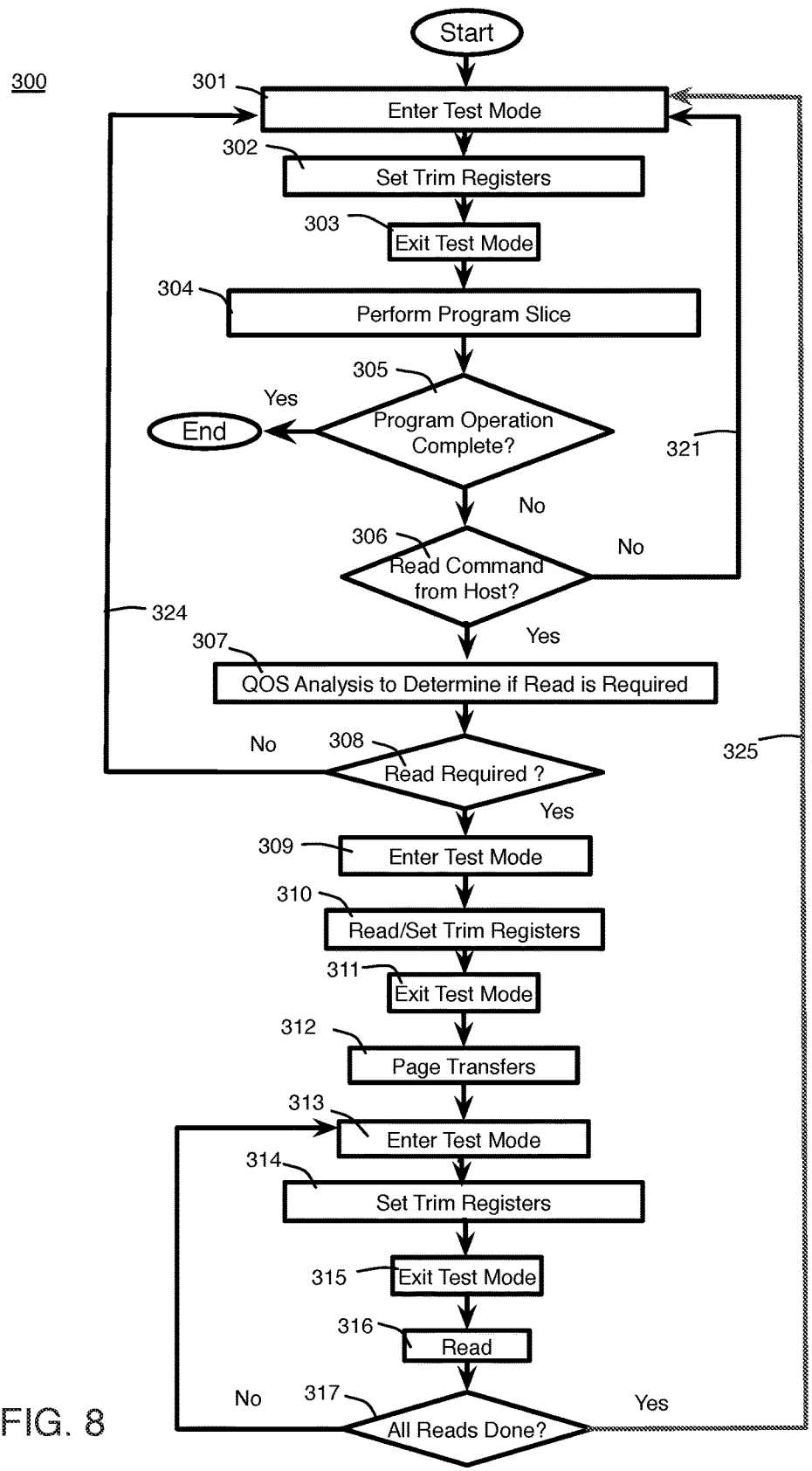
FIG. 8 is a diagram illustrating a method for performing operations using a nonvolatile memory device in which a slicing approach is used to perform a suspendable program operation in accordance with an embodiment of the present invention.

FIG. 8 illustrates an exemplary method 300 for performing a suspendable program operation in which the slicing approach is used and in which QoS is used to determine whether or not a suspend is needed to meet the QoS target criteria. As shown by step 301, nonvolatile memory controller 11 communicates with the nonvolatile memory device 20 being programmed such that the nonvolatile memory device 20 being programmed enters the test mode. As shown by step 302, nonvolatile memory controller 11 then sets the trim registers 25 of the nonvolatile memory device 20 being programmed. In the present embodiment, data to be programmed are loaded into the trim registers 25 of the nonvolatile memory device 20 being programmed in step 302 along with register settings that control the parameters of the program process. As shown by step 303, nonvolatile memory controller 11 communicates with the nonvolatile memory device 20 being programmed such that the nonvolatile memory device 20 being programmed exits the test mode. A program slice is then performed as shown by step 304. The information loaded into the registers in step 302 controls the number of programming pulses and the voltage levels to be applied in the program slice, and the program slice is always allowed to proceed to completion. For example, the program slice may be one of the slices 51a, 51b, or 51c shown in FIG. 4B. After completion of the program slice, NAND shared algorithm circuit 16 is operable to determine whether the program operation is complete at step 305 by determining whether all program slices have been performed and if all program slices have been performed, the suspendable program operation ends.

If the suspendable program operation is not complete, NAND shared algorithm circuit 16 is operable to determine whether a read command has been received from the host at step 306. When a read command has not been received from the host, NAND shared algorithm circuit 16 is operable to start the next program slice as shown by line 321.

When a read command has been received from the host at step 306, NAND shared algorithm circuit 16 is operable to perform a QOS analysis to determine if a read is required 307. In one embodiment, the QoS analysis compares one or more QoS timing value to a timing value threshold, and a read is required if the QoS value reaches the timing value threshold.

If the analysis of step 307 determines that a read is not required, at step 308 NAND shared algorithm circuit 16 is operable to return as shown by line 324 and the next program slice is performed without any intervening host-requested read operation being performed. If the analysis of step 307 determines that a read is required at step 308, NAND shared algorithm circuit 16 is operable to perform the pending reads prior to performing the next program segment. When one or more read is required, NAND shared algorithm circuit 16 is operable to communicate with nonvolatile memory device 20 such that nonvolatile memory device 20 enters the test mode 309, reads 310 the trim registers of the nonvolatile memory device 20 to determine the current programming state of the nonvolatile memory device 20, set one or more trim registers 310 and to load one or more instruction that will cause microcontroller 22 to perform the required page transfers of step 312 upon exiting the test mode in step 311 to free up the registers needed for the following read operations. In embodiments in which nonvolatile memory devices 20 are SLC NAND devices, the set of registers that hold the values being programmed are moved. For MLC NAND the data in the registers of upper and lower pages may be moved. For TLC NAND the date in the registers of upper, middle and lower pages may be moved. The page transfers of step 312 may move the data being programmed to unused registers in nonvolatile memory device 20, and subsequent page transfers may move the data being programmed back to the required registers prior to performing the next program slice in step 302; thereby allowing them to be modified in step 302 as needed to perform the subsequent program slice.

The required reads are then performed as shown by steps 313-316. More particularly, NAND shared algorithm 16 instructs the microcontroller to enter the test mode 313, sets 314 trim registers 25 of nonvolatile memory device 20 required for performing the read operation in step 316 (e.g., loads the addresses to be read along with one or more instruction that, when performed by the microcontroller will cause the microcontroller perform the read operation). After exiting the test mode in step 315 the read operation is performed as shown by step 316. In this embodiment, NAND shared algorithm circuit 16 and microcontroller 22 of the nonvolatile memory device 20 being read are operable to perform the read operation using the data and instructions loaded into the registers and a conventional READ instruction is not sent to the nonvolatile memory device 20 as occurs in conventional NAND read operations (e.g., not a page read instruction such as is specified in JESD230B paragraph 5.1). In an alternate embodiment, instead of performing steps 309-316, a conventional read command is sent from nonvolatile memory controller 11 to nonvolatile memory device 20, which is then operable to perform the read and output the results of the read without entering the test mode. Once all reads are done the programming of the next operation slice begins as shown by arrow 325.

In one embodiment, NAND shared algorithm circuit 16 uses a "suspend emulation" approach to provide program suspend functionality. In this approach, suspend (aka Abort) is totally asynchronous. At each Abort, NAND shared algorithm circuit 16 communicates with nonvolatile memory device 20 to understand at which stage the programming operation stopped. More particularly, NAND shared algorithm circuit 16 reads all the relevant trim registers 25. At resume, the communication goes in the opposite direction: this time NAND shared algorithm circuit 16 drives the nonvolatile memory device 20 back to where the programming operation stopped by writing to trim registers 25. When method 100 or 200 is used to provide suspend emulation, the programming operation can be initiated either using the test mode in steps 102-106 or by sending a conventional program command in step 201 from program/ease circuit 15 to nonvolatile memory device 20. Then, a following iteration of steps 102-106 suspends the program operation. The pending read operations may be performed by sending a conventional read command in step 201 or by an iteration of steps 102-106. A subsequent iteration of steps 102-106 then resumes the suspended program operation.

Figure 9:
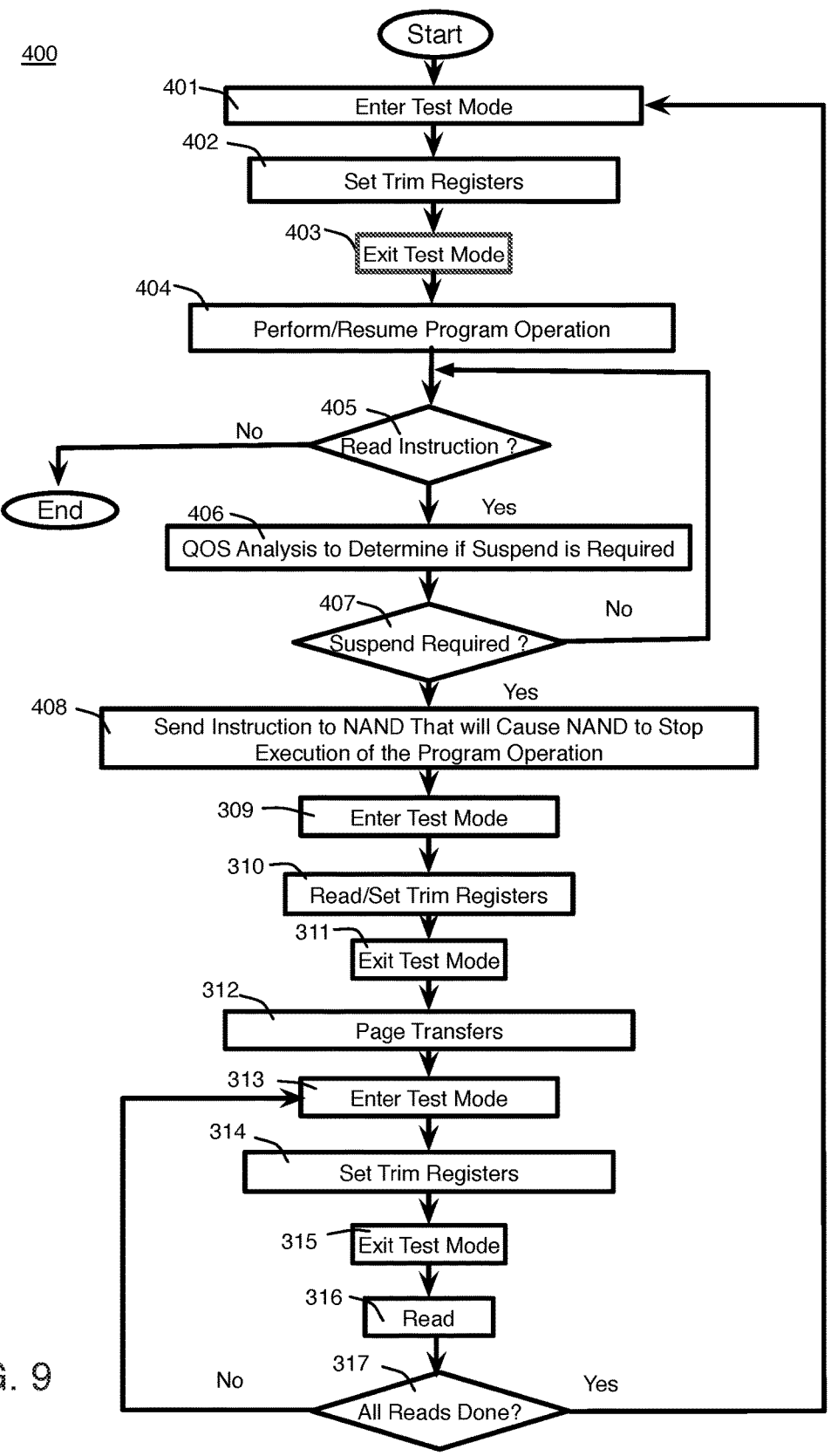
FIG. 9 is a diagram illustrating a method for performing operations using a nonvolatile memory device in which a suspend emulation approach is used in accordance with an embodiment of the present invention.

FIG. 9 illustrates a method 400 that uses the suspend emulation approach. As shown by step 401, nonvolatile memory controller 11 communicates with the nonvolatile memory device 20 being programmed such that the nonvolatile memory device 20 being programmed enters the test mode. As shown by step 402, nonvolatile memory controller 11 then sets the trim registers 25 of the nonvolatile memory device 20 being programmed. The data to be programmed is loaded into the registers of the nonvolatile memory device 20 being programmed in step 402 along with trim register settings that control the parameters of the program process. As shown by step 403, nonvolatile memory controller 11 communicates with the nonvolatile memory device 20 being programmed such that the nonvolatile memory device 20 being programmed exits the test mode. A program operation is then performed as shown by step 404. The information loaded into the registers in step 402 controls the number of programming pulses and the voltage levels to be applied in the program operation, and the program operation will proceed to completion when not aborted. If no read instruction is received at step 405 the process ends (and the program operation of step 404 completes). When a read instruction is received from the host, at step 406 a QoS analysis is performed to determine if a suspend is required. When the QoS analysis determines that suspend is not required at step 407, NAND shared algorithm circuit 16 is operable to return to step 405 (the read will remain pending at nonvolatile memory controller 11 and may be performed after the end of method 400 e.g., using a conventional read command). When a suspend is required, as shown by step 408, NAND shared algorithm circuit 16 sends an instruction 408 to the nonvolatile memory device 20 being programmed that will cause the nonvolatile memory device 20 to stop execution of the program operation (e.g., abort). This can be done by entering the test mode, setting registers of the microcontroller to input instructions into the microcontroller that, when performed by the microcontroller, will stop the execution of the program operation. In one exemplary embodiment step 408 includes setting one or more trim register 25 that is a run time register.

Figure 5:
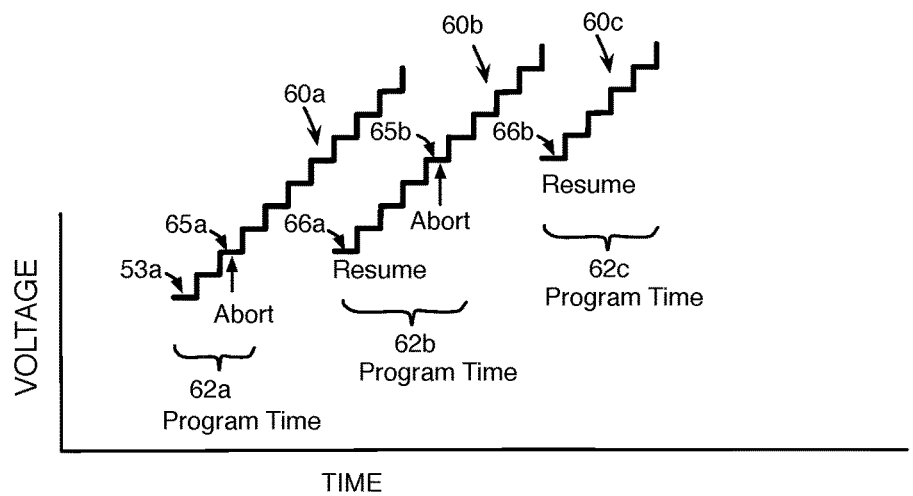
FIG. 5 is a diagram showing voltage versus time, and illustrates an exemplary program operation of a nonvolatile memory device using a suspend emulation approach in accordance with an embodiment of the present invention.

In the exemplary embodiment that is illustrated in FIG. 5, the program operation of step 404 starts at voltage step 53a that will form voltage staircase 60a if allowed to complete. In this example, step 408 aborts the program operation at program step 65a. The program operation is stopped by nonvolatile memory device 20 after program step 65a is completed. Steps 309-317 are then performed to determine where the program stopped, to perform page transfers and to perform the pending host-requested reads. In the embodiment shown in FIG. 5, the read of trim registers 25 in step 310 determine the program step 65a, 65b where programming stopped, and the one or more values that were read in step 310 may be stored by NAND shared algorithm circuit 16 in storage module 12 while the read operations of steps 313-316 are being performed. Following the read operations, the program operation is then resumed at step 401 by setting trim registers 25 while in the test mode 402 using the values that were read in step 310, which would form the program staircase 60b if allowed to complete. In the present embodiment, setting trim registers 25 stores a value in one or more of trim registers 25 that indicates a programming step such that, upon resumption of the program operation, the last voltage step 65a is repeated (e.g., voltage step 66a of voltage staircase 60b). In this example, the program operation is again aborted at program step 65b by performing step 408. The program operation is then stopped by nonvolatile memory device 20 after program step 65b is completed. As shown by steps 309-317 a read to determine where the program operation stopped 310, page transfers 312 and pending reads 316 are performed. Following the read operations of steps 313-316, the program operation is resumed at step 401 beginning at program step 66b (a repeat of program step 65b), which is allowed to complete to perform program staircase 60c.

In other embodiments NAND shared algorithm circuit 16 of the present invention uses a "Time/Voltage correlation" approach to provide program suspend functionality. The Time/Voltage correlation approach is the same as the Suspend Emulation approach except that a different methodology is used to determine where to restart each programming staircase. More particularly, a timer is started at the beginning of each programming operation and is stopped at the following Abort. In one embodiment, nonvolatile memory controller 11 includes a timer that is started and stopped by NAND shared algorithm circuit 16. In the embodiment shown in FIG. 5, the timer starts at the beginning of program step 53a and ends at the end of program step 65a to give program time 62a for the first abort of program operation 60a. This program time is compared to the known staircase values stored in storage module 12 to determine the program step to resume with. The timer is started again at the beginning of succeeding program slice 60b and is stopped at the following Abort to identify the corresponding program time 62b. In the embodiment of FIG. 4A program staircase 41a has a program time 42a and program staircase 41b has program time 42b. Similarly, program staircase 51a has a program time 52a and program staircase 51b has program time 52b.

Because there is a sequence of programming pulses, and each pulse is executed by applying a voltage higher than the previous one, there is a correlation between voltage and time. While the programming step has a fixed and very well controlled duration, the number of verifies is variable, depending on how the programming operation progresses and on how many $V_{TH}$ distributions need to be verified. As is known to those skilled in the art, TLC memories may have multiple programmed distributions. As a consequence, the Time/Voltage correlation approach has a limited precision. In this case, the NAND shared algorithm 16 doesn't need to communicate with the nonvolatile memory device 20 to understand at which stage the programming operation stopped; it determines the program step to resume with (e.g., 66a, 66b) using the programming time 62a, 62b.

In the slicing approach, the number of suspends is known as the number of slices is determined in advance. However, when the suspend emulation approach or the Time/Voltage correlation approach is used, the number of suspends will vary based on the number of required reads. However, suspends vary the BER of the nonvolatile memory device 20, and if too many suspends occur a bad block condition can occur or the nonvolatile memory device 20 may no longer meet the BER required to meet product specifications.

In one embodiment NAND shared algorithm 16 is also operable to perform an erase suspend. In one embodiment, the erase suspend includes entering the test mode, loading registers of microcontroller 22 of the nonvolatile memory device 20 performing the erase operation, and exiting the test mode such that the microcontroller of the nonvolatile memory device 20 performing the erase operation stops execution of the erase operation. The erase suspend may include operations performed in the same manner as discussed in methods 100, 200, 300 and 400. Embodiments of the present invention include a suspendable erase that uses the slicing approach of FIGS. 4A-4B to perform erase slices, an erase suspend emulation that uses the approach shown in FIGS. 5 and 9 to suspend an ongoing erase operation, and an embodiment that uses the time/voltage correlation approach. Accordingly, the methods and apparatus of the present invention may be used for suspending program operations, suspending erase operations, or suspending both program and erase operations.

Figure 10:
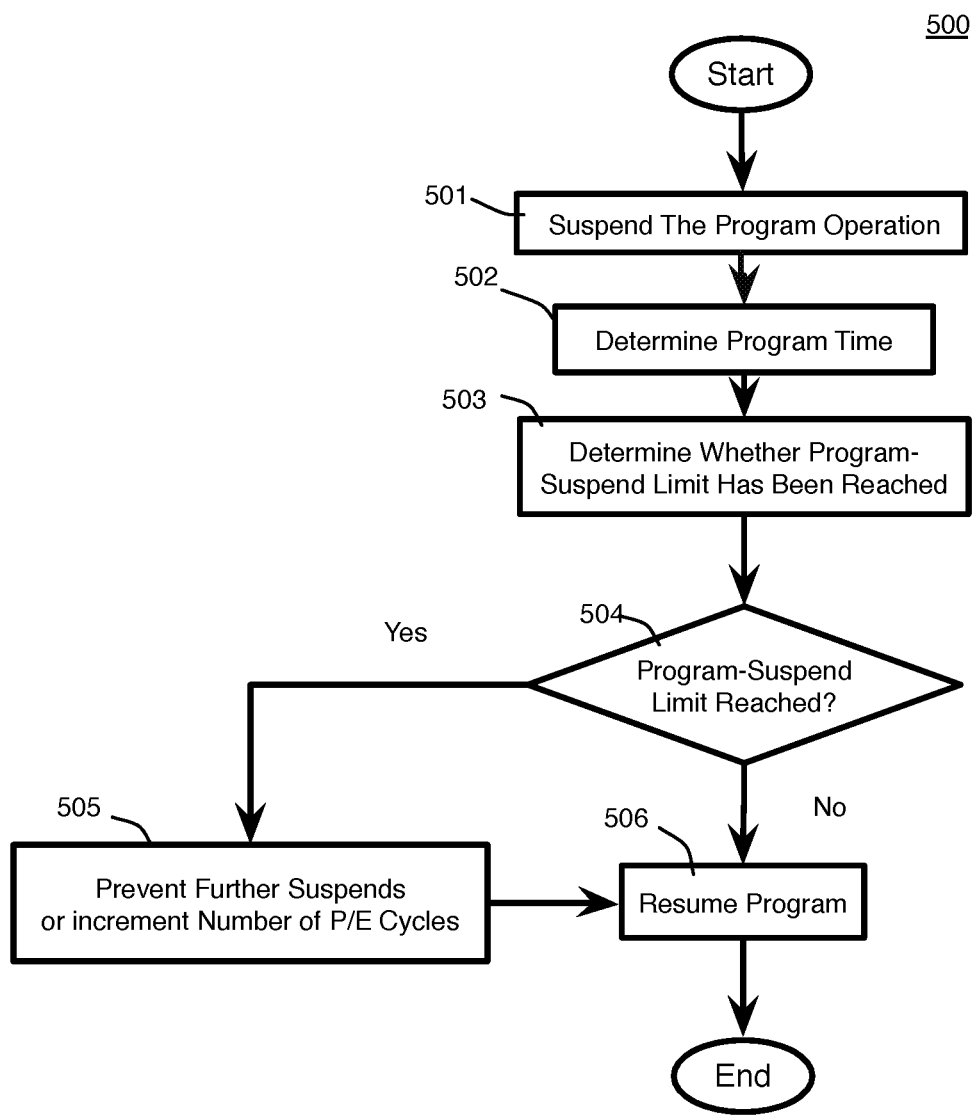
FIG. 10 is a flow diagram illustrating a method for managing program suspend operations in accordance with an embodiment of the present invention.

In one embodiment that is illustrated in FIG. 10, a method 500 is shown in which, after a program operation of the nonvolatile memory device 20 is suspended 501, program time is determined 502. In the present embodiment, program time is determined in the same manner as discussed above in the Time/Voltage correlation approach. As shown by step 503 a determination is made as to whether a program suspend limit has been reached. Until the erase suspend limit is reached, the suspend operation is resumed 506 in the same manner as discussed in FIGS. 1-9. When the program-suspend limit has been reached, subsequent suspends of the program operation are prevented 505 and the program operation is resumed and allowed to complete without further suspension 506. More particularly, the presently ongoing program operation is not allowed to be suspended further (e.g., the following program staircase 60b, 60c is allowed to complete).

In the embodiment shown in FIG. 1 NAND shared algorithm circuit 16 is configured for determining a suspend time for each occurrence where a program operation of the nonvolatile memory device is suspended, for determining whether a limit has been reached using the determined suspend time and for preventing subsequent suspends of the program operation when the program-suspend limit has been reached. In the present embodiment NAND shared algorithm circuit 16 is operable to monitor program and erase circuit 15 and start a timer when the program instruction is loaded into the nonvolatile memory device 20 being programmed. NAND shared algorithm circuit 16 is operable for monitoring a register of the nonvolatile memory device 20 being programmed that indicates when the program operation has been suspended, and stopping the timer when the value in the register changes to indicate suspension of the program operation. Alternatively, the read/busy signal can be used as an indicator to determine when the program operation has been suspended. In this embodiment, the time at which the program operation is suspended is the time at which the program/busy output of the nonvolatile memory device 20 being programmed transitions back to a logical high. For example, in the embodiment shown in FIG. 5, the timer starts at the beginning of program step 53a and ends at the end of program step 65a to give program time 62a. The timer is started again at the beginning program step 66a of succeeding program slice 60b and is stopped at the following Abort to identify the corresponding program time 62b. The timer is started again at the beginning program step 66b of succeeding program slice 60c and is stopped at the following Abort to identify the corresponding program time 62c.

In the present embodiment, sample nonvolatile memory devices that are similar to nonvolatile memory devices 20 shown in FIG. 1 are tested, which may be the same manufacturer, the same model, type and manufacturing batch as nonvolatile memory devices 20. The testing may determine one or more program-suspend limit and one or more program time threshold that will maintain the operation of the sample nonvolatile memory devices within required bit error rates established for the sample nonvolatile memory devices. In one embodiment, the program-suspend limit(s) is chosen to obtain the highest possible number of program suspends while maintaining the operation of the sample nonvolatile memory devices within required bit error rates established for the sample nonvolatile memory devices. The program-suspend limit(s) and program time threshold(s) may be stored in nonvolatile memory system 10 (e.g., in memory storage 12, the spare area of one or more pages of each nonvolatile memory device 20 or on external memory device 17) prior to shipping nonvolatile memory system 10 or nonvolatile memory controller 11 to a customer.

In one embodiment, a table indicating program and erase cycle values and corresponding program-suspend limit values and program time threshold values is stored, with the values to be used determined by indexing the table with the current number of program and erase cycles of the block of the nonvolatile memory device 20 being programmed. As the time required for programming and erasing memory cells, and BER varies as the number of program and erase cycles increases, this provides identification of a program-suspend limit that is more accurate since it represents the current point of the lifetime of the nonvolatile memory device 20 being programmed.

By preventing subsequent suspends of the program operation in step 505 when the program-suspend limit has been reached, and identification of one or more program-suspend limit that correspond to the characteristics of nonvolatile memory devices 20, the methods and apparatus of the present invention maintain BER of nonvolatile memory devices 20 within the range required to maintain manufacturer-specified endurance and retention specifications while allowing for a sufficient number of program suspends of nonvolatile memory devices 20 to meet QoS requirements.

In one embodiment, instead of preventing further suspends in step 505, the number of program and program cycles is incremented by one when the program-suspend limit is reached. In this embodiment, the testing of sample nonvolatile memory device 20 determines a program-suspend limit that corresponds to the effect of the suspensions on the BER of the block being programmed. In one embodiment, the program-suspend limit is chosen so that BER introduced by the suspends allowed by the program-suspend limit is equal to the BER introduced by a single program and erase cycle. In the embodiment shown in FIG. 1, at step 505 NAND shared algorithm circuit 16 is operable to indicate to status circuit 13 that the number of program and erase cycles is to be incremented by one and status circuit 13 is operable to increment the number of program and erase cycles of the block being erased by one. Alternatively, NAND shared algorithm circuit 16 is operable to increment the number of program and erase cycles by 1 independently of status circuit 13 (e.g., by incrementing a value stored in memory storage 12 or in the spare area of the nonvolatile memory device 20 being programmed). After incrementing the number of P/E cycles, NAND shared algorithm circuit 16 resets the counters used for determining whether the program-suspend limit has been reached and allows the program operation to resume in step 506. This allows for the user to make a trade-off between speed and lifespan of nonvolatile memory devices 20. More particularly, the lifespan of the block is reduced as a result of the number of added program and erase cycles, reducing the overall lifespan of the nonvolatile memory devices 20. However, the number of suspends is not limited at all, allowing for a much faster nonvolatile memory system and a higher quality of service than when further suspends are prevented in step 505. By increasing the number of P/E cycles for the block being programmed each time that the limit is reached, the method and apparatus of the present invention takes into account the effect of the suspends on BER.

Figure 11:
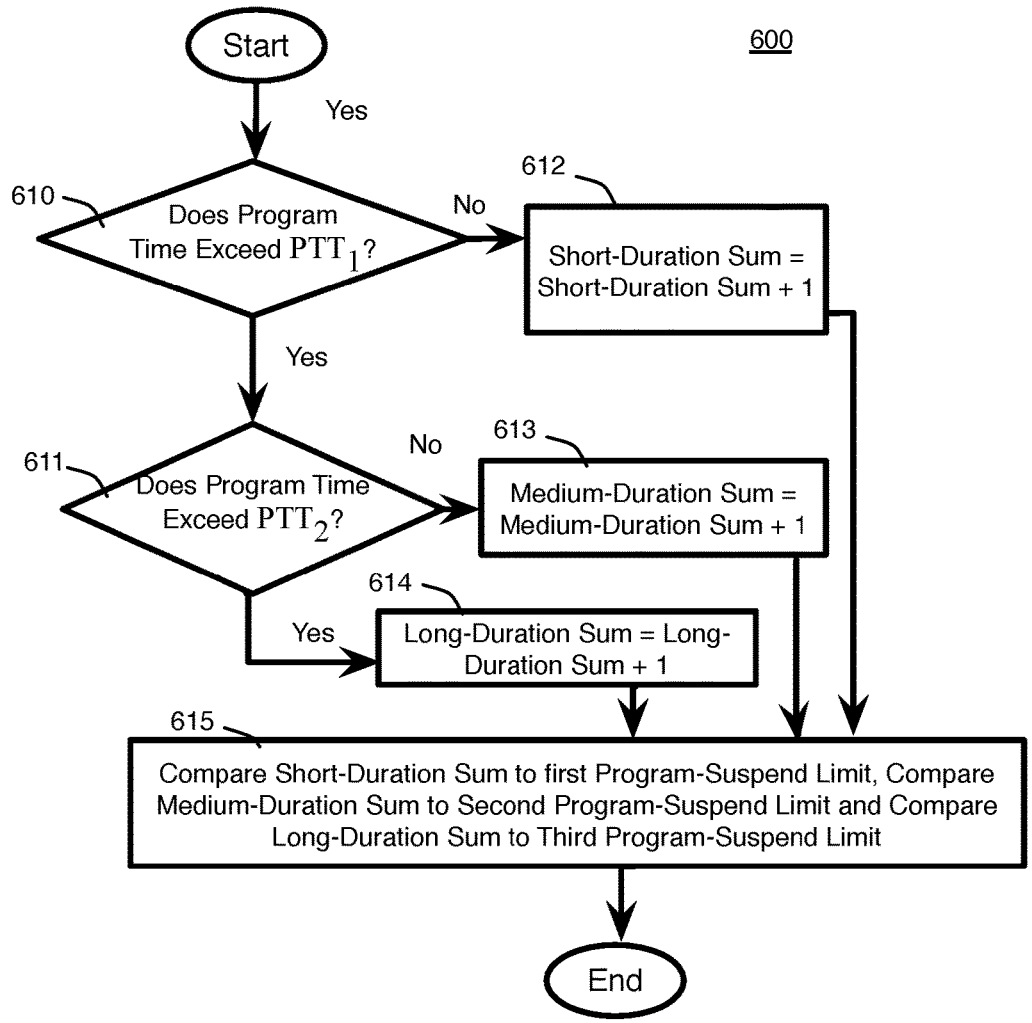
FIG. 11 is a flow diagram illustrating a method for managing program suspend operations in accordance with an embodiment of the present invention.

In one embodiment that is illustrated in FIG. 11 a method 600 is shown in which suspend time is categorized into three groupings, one group that includes suspend times having a short-duration, a second group that includes suspend times having a medium-duration and a third group that includes suspend times having longer-duration. In this embodiment, the testing of sample nonvolatile memory devices 20 determines a limit that includes a first program-suspend limit, a second program-suspend limit and a third program-suspend limit. The testing also identifies a first program time threshold ($PTT_1$) and a second program time threshold ($PTT_2$) that define the three groupings of suspend time, with the first program time threshold having a value that is less than the second program time threshold.

The number of suspends having a program time that does not exceed $PTT_1$ is summed to obtain a short-duration sum in steps 610, 612. The number of suspends having a program time that exceeds the first program time threshold and that does not exceed $PTT_2$ is summed to obtain a medium-duration sum in steps 611, 613. The number of suspends having a program time that exceeds $PTT_2$ is summed to obtain a long-duration sum in steps 611, 614. The summing is done for each page being programmed. For example, counters in NAND shared algorithm circuit 16 may be incremented upon each program suspend operation and the results stored in memory storage 12. The determined sums are compared 615 to the corresponding program suspend limits to determine when the program-suspend limit has been reached. More particularly, the short duration sum is compared to the first program-suspend limit, the medium duration sum is compared to the second program-suspend limit and the long duration sum is compared to the third program-suspend limit. The program-suspend limit is reached 504 when the short duration sum reaches the first program-suspend limit or when the medium duration sum reaches the second program-suspend limit or when the long duration sum reaches the third program-suspend limit. In the present embodiment, the first program-suspend limit is greater than the second program-suspend limit and the second program-suspend limit is greater than the third program-suspend limit such that more short-duration-program-time suspends are allowed than medium-duration-program-time suspends, and more medium-duration-program-time suspends are allowed than long-duration-program-time suspends.

Following is an example in which the testing of exemplary sample nonvolatile memory devices 20 has determined that up to 20 suspends can be tolerated for program time intervals of less than 150 microseconds, up to 15 suspends can be tolerated for program time intervals of more than 150 microseconds and up to 250 microseconds, and up to 10 suspends can be tolerated for program time intervals of more than 500 microseconds and in which further suspends are prevented in step 505. In this embodiment, $PTT_1$ is set at 150 microseconds, which is less than a third of the duration of the program pulse used by nonvolatile memory device 20 and $PTT_2$ is set at 500 microseconds. The first program-suspend limit is set at 20, the second program-suspend limit is set at 15 and the third program-suspend limit is set at 10.

Each time a suspend is performed having a time within the first interval (less than or equal to 150 microseconds) the counter for the short duration sum is incremented by one. Each time a suspend is performed having a time within the second interval (more than 150 microseconds and less than or equal to 500 microseconds) the counter for the medium duration sum is incremented by one. Each time a suspend is performed having a time within the third interval (more than 500 microseconds) the counter for the long duration sum is incremented by one. When the first program-suspend limit reaches 20, the second program-suspend limit reaches 15 or the third program-suspend limit reaches 10 further suspends are prevented (or the number of P/E cycles is incremented).

By allowing more short-duration-program-time suspends than medium-duration-program-time suspends, and more medium-duration-program-time suspends than long-duration-program-time suspends, the method and apparatus of the present invention maintain BER of nonvolatile memory devices 20 within the range required to maintain manufacturer-specified endurance and retention specifications while allowing for a sufficient number of program suspends of nonvolatile memory devices 20 to meet QoS requirements.

In other embodiments, program time may be categorized into more or fewer groupings, depending on the characteristics of nonvolatile memory device 20. In one alternate embodiment, only two groups are used, a first group having suspend times with short-duration and a second group that includes suspend times having a greater duration. In one exemplary embodiment, the program-suspend limit includes a first program-suspend limit and a second program-suspend limit, and the determining whether the program-suspend limit has been reached includes summing the number of suspends having a program time that does not exceed a first program time threshold to obtain a first sum and summing the number of suspends having a program time that exceeds the first program time threshold to obtain a second sum. In this embodiment, the program-suspend limit is reached when the first sum reaches the first program-suspend limit or when the second sum reaches the second program-suspend limit. For example, only $PTT_1$ of 150 microseconds is used, producing a first sum that is the sum of suspend times that do not exceed $PTT_1$ and a second sum that is the sum of suspend times that exceed $PTT_1$. In this embodiment, the testing identifies a short duration program time window in which the program pulses are not effective to move the BER of the cells being programmed, and allows for an increased number of suspends that occur within the identified window as compared to the number of suspends allowed outside of the identified window.

The program-suspend limit may also be a weighted program time limit (WPT limit). In one embodiment, a table is stored indicating program and program cycle values and corresponding program-suspend limit values (weighted program time limits) and program time threshold values, with the values to be used determined by indexing the table with the current number of program and erase cycles of the nonvolatile memory device 20 being programmed.

In one embodiment, weighted program time (WPT) is determined by assigning a different weighted program time value to each of a plurality of program time intervals. Since suspend times having shorter duration have less impact on the BER than longer suspend times, suspend times having a shorter duration will have a lower weighting factor than suspend times having an intermediate program time and suspend times having a longer suspend time. Also, suspend times having medium duration have less impact on the BER than suspends with longer suspend times and therefore will have a lower weighting factor than suspends having a longer suspend time.

In the present embodiment NAND shared algorithm circuit 16 is operable for determining weighted suspend time, summing the determined weighted suspend times for the program operation and storing the sum for each program operation in memory storage 12 or external memory 17. In addition, NAND shared algorithm circuit 16 is operable for comparing the determined sum to the weighted program time limit for determining whether the program-suspend limit has been reached. When the summed weighted program time reaches the weighted program time limit NAND shared algorithm circuit 16 resets summed weighted program time to zero and prevents further suspends of the present program operation (or incrementing the number of P/E cycles).

Figure 12:
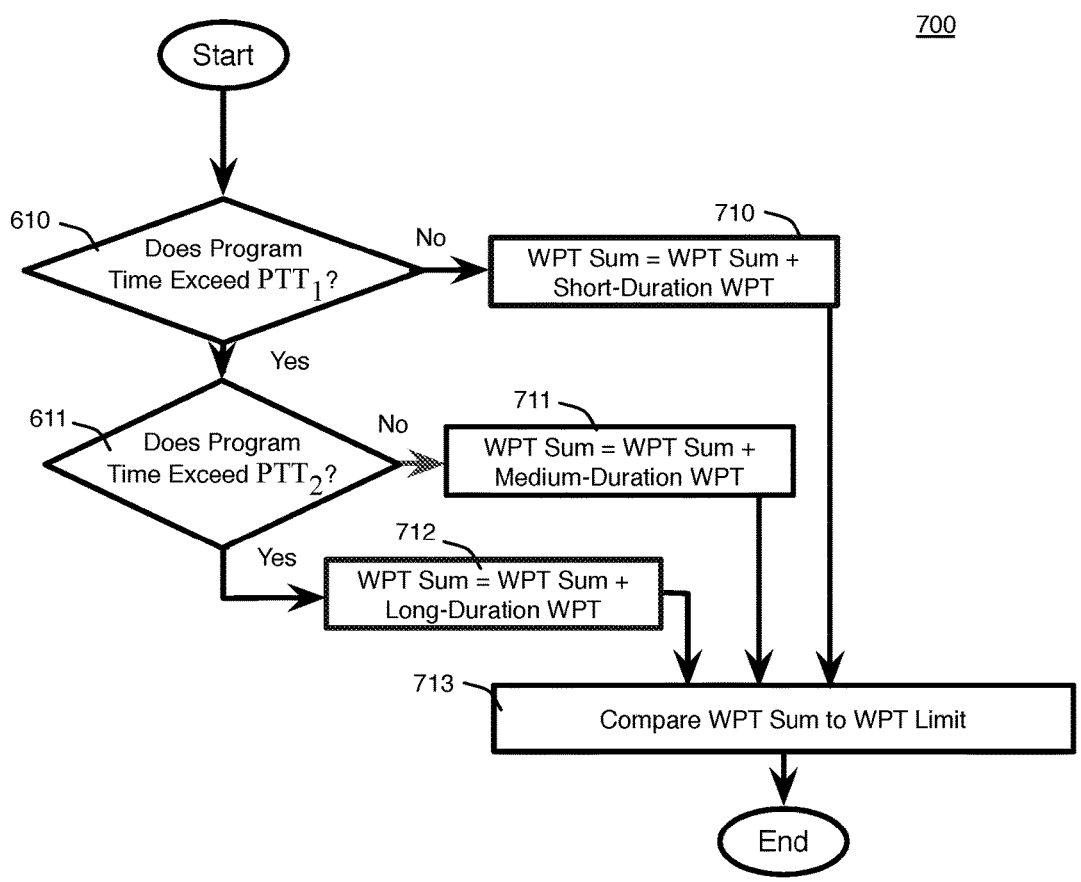
FIG. 12 is a flow diagram illustrating a method for managing program suspend operations in which a weighted suspend time is used accordance with an embodiment of the present invention.

In one embodiment that is illustrated in method 700 of FIG. 12, the testing of sample devices identifies a weighted program time limit (WPT limit), a $PTT_1$ and a $PTT_2$ that define three groupings of program time and corresponding weighted program times. In this embodiment, the weighted program time (WPT) is equal to a first weighted program time (Short-Duration WPT) when the determined program time does not exceed $PTT_1$ in step 610. The weighted program time is equal to a second weighted program time (Medium-Duration WPT) when the determined program time exceeds $PTT_1$ but does not exceed $PTT_2$ in step 611. Similarly, the weighted program time is equal to a third weighted program time (Long-Duration WPT) when the determined program time exceeds $PTT_2$ in step 611. The weighted program time sum (WPT Sum) is incremented by the short-duration WPT when the determined program time does not exceed $PTT_1$ in steps 610, 710, incremented by the medium-duration WPT when the determined program time exceeds $PTT_1$ but does not exceed a $PTT_2$ in steps 611, 711 and incremented by the long-duration WPT when the determined program time exceeds $PTT_2$ in steps 611, 712.

The Long-Duration WPT is greater than the Medium-Duration WPT, and the Medium-Duration WPT is greater than the Short-Duration WPT. The WPT sum is compared to the WPT limit and the program-suspend limit is reached when the WPT sum reaches the WPT limit. Thereby, more short-duration-suspend-time suspends are allowed than medium-duration-suspend-time suspends, and more medium-duration-suspend-time suspends are allowed than long-duration-suspend-time suspends. This maintains BER of nonvolatile memory devices 20 within the range required to maintain manufacturer-specified endurance and retention specifications while allowing for a sufficient number of program suspends of nonvolatile memory devices 20 to meet QoS requirements.

Following is an exemplary embodiment in which testing of exemplary NAND devices has determined that up to 20 suspends can be tolerated for program time intervals of less than 150 microseconds, up to 15 suspends can be tolerated for program time intervals of more than 150 microseconds and up to 500 microseconds, and up to 10 suspends can be tolerated for program time intervals of more than 500 microseconds. This gives a weighting factor of 45/20=2.25 for suspend times having a short-duration suspend time, a weighting factor of 45/15=3 for program suspends having a medium-duration program time and a weighting factor of 45/10=4.5 for program suspends having a long-duration program time and a weighted program time limit of 45. Each time a suspend is performed having a time within the first interval (less than or equal to 150 microseconds) a WPT of 2.25 is summed. Each time a suspend is performed having a time within the second interval (more than 150 microseconds and less than or equal to 500 microseconds) a WPT of 3 is summed. Each time a suspend is performed having a time within the third interval (more than 500 microseconds) a WPT of 4.5 is summed. When the WPT sum reaches 45, further suspends are prevented (or the number of P/E cycles is incremented). Thus, a total number of 20 suspends are allowed when all are within the first interval, a total of 15 suspends are allowed when all are within the second interval, and a total of 10 suspends are allowed when all are within the third interval.

In other embodiments program time may be categorized into more or fewer groupings, depending on the characteristics of nonvolatile memory device 20. In one alternate embodiment, method 700 of FIG. 12 includes only two groups, a first group having suspend times with short duration and a second group that includes suspend times having a greater duration, with different weighting applied to each group. In this embodiment, the weighted program time is equal to a first weighted program time when the determined program time does not exceed $PTT_1$ and the weighted program time is equal to a second weighted program time that is greater than the first weighted program time when the determined program time exceeds $PTT_1$. In this embodiment, the program-suspend limit is reached when the sum reaches the weighted program-suspend limit. In this embodiment, the testing process identifies a short duration program time window in which the program pulses are not effective to move the BER of the cells being programmed, and allows for an increased number of suspends that occur within the identified window as compared to the number of suspends allowed outside of the identified window.

In the present embodiment methods 500, 600, 700 are performed on a page by page basis such that the number of suspends of each program operation is limited. In one alternate embodiment, method 500 is performed on a block-by-block basis, with all program suspends for a block summed and compared to a program-suspend limit for the block. Once the program-suspend limit for the block has been reached, no further suspends of that block are allowed for the lifetime of the nonvolatile memory device.

In one embodiment, the process of methods 500, 600, 700 is also used for erase suspends. In this embodiment nonvolatile memory controller 11 is configured for determining a suspend time each time that an erase operation of the nonvolatile memory device is suspended, wherein the determined suspend time for a first suspend of the erase operation is the time between a start of the erase operation and the first suspend of the erase operation, and the determined suspend time for each additional suspend of the erase operation is the time between a resumption of the erase operation and the following suspend of the erase operation. Nonvolatile memory device 11 then determines whether an erase-suspend limit has been reached using the determined suspend time of the erase operation. When the erase-suspend limit has been reached nonvolatile memory controller 11 is configured for preventing subsequent suspends of the erase operation or incrementing the number of program and erase cycles in the same manner as discussed in FIGS. 1-9. Because the timing required to perform an erase operation is different than that required for a program operations, it is appreciated that, when methods 600, 700 are used for erase suspends, a first erase time threshold ($ETT_1$) is used in step 610 that is different from $PTT_1$ and a second erase time threshold ($ETT_2$) is used in step 611 that is different from $PTT_2$ (e.g., $ETT_1$=300 microseconds, $ETT_2$=1,000 microseconds).

Though program suspend limitation (or incrementing the number of P/E cycles) of methods 500, 600 and 700 has been described above in conjunction with the methods of steps 100, 200, 300 and 400, this feature can also be implemented to add supplemental functionality to a nonvolatile memory device 20 that is capable of performing a program suspend command. In this embodiment, a conventional program command is used instead of using the test mode, and the program time is determined using the time at which the program suspend command is sent from nonvolatile memory controller 11 to the nonvolatile memory device 20 being programmed. In one embodiment, suspend time is determined to be the time between sending a program function start command (e.g., D0h) and the suspend command (e.g., 61h) or the time between sending the resume command 54 (e.g., D2h) and the suspend command 53a (e.g., 61h). In the present embodiment, more suspends are allowed than are specified by the manufacture of the nonvolatile memory device 20, by allowing for more program suspends, QoS is improved as compared to prior art systems limited to the number of suspends allowed by the manufacturer of the nonvolatile memory device 20.

Unless specifically stated otherwise as apparent from the discussion, it is appreciated that throughout the description, discussions utilizing terms such as "testing", "identifying", "generating", "comparing", "sending", "summing", "preventing", or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, for purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

We claim:

1. A method comprising:
   initiating operation of a nonvolatile memory device that is not capable of performing a program suspend command;
   sending a first program instruction and a first set of trim values from a nonvolatile memory controller to the nonvolatile memory device while the nonvolatile memory device is in a test mode such that the first program instruction and the first set of trim values are stored in trim registers of the nonvolatile memory device;

exiting the test mode, the nonvolatile memory device operable upon exiting the test mode to perform a first program slice by executing the first program instruction using the first set of trim values so as to apply a first predetermined number of program pulses to memory cells of a NAND memory array of the nonvolatile memory device;

after performing the first program slice, sending a second program instruction and a second set of trim values from the nonvolatile memory controller to the nonvolatile memory device while the nonvolatile memory device is in the test mode such that the second program instruction and the second set of trim values are stored in the trim registers;

exiting the test mode, the nonvolatile memory device operable upon exiting the test mode to perform a second program slice by executing the second program instruction using the second set of trim values so as to apply a second predetermined number of program pulses to the memory cells of the NAND memory array; and if one or more read command is pending at the nonvolatile memory controller when the first program slice is completed, performing the one or more pending read command prior to performing the second program slice.

2. The method of claim 1 wherein the first set of trim values include one or more value that indicates the first predetermined number of program pulses and further wherein the second set of trim values include one or more value that indicates the second predetermined number of program pulses.

3. The method of claim 1 wherein the second set of trim values include one or more value that indicates a programming step such that the last voltage step of the first slice is repeated.

4. The method of claim 1 further comprising:
when one or more read command is pending at the nonvolatile memory controller when the first program slice is completed:
  performing a quality of service analysis;
  performing the one or more pending read command prior to performing the second program slice when the quality of service analysis indicates that a program suspend is required to meet a quality of service criteria; and
  not performing the one or more pending read command prior to performing the second program slice when the quality of service analysis does not indicate that a program suspend is required to meet the quality of service criteria.

5. The method of claim 1 further comprising
sending a third program instruction and a third set of trim values from the nonvolatile memory controller to the nonvolatile memory device while the nonvolatile memory device is in a test mode such that the third program instruction and the third set of trim values are stored in trim registers of the nonvolatile memory device;

exiting the test mode, the nonvolatile memory device operable upon exiting the test mode to perform a third program slice by executing the third program instruction using the third set of trim values so as to apply a third predetermined number of program pulses to the memory cells of the NAND memory array; and when one or more additional read command is pending at the nonvolatile memory controller when the second program slice is completed, performing the one or more additional pending read command prior to performing the third program slice.

6. The method of claim 5 further comprising:
when the one or more pending read command is performed prior to performing the second program slice, determining a suspend time;
determining whether a limit has been reached using the determined suspend time; and
when the limit has been reached, not performing the one or more additional pending read command prior to performing the third program slice.

7. A nonvolatile memory controller comprising:
a NAND shared algorithm circuit configured to:
  send a first program instruction and a first set of trim values to a nonvolatile memory device while the nonvolatile memory device is in a test mode such that the first program instruction and the first set of trim values are stored in trim registers of the nonvolatile memory device, wherein the nonvolatile memory device is not capable of performing a program suspend command;
  communicate with the nonvolatile memory device such that the nonvolatile memory device exits the test mode, the nonvolatile memory device operable upon exiting the test mode to perform a first program slice by executing the first program instruction using the first set of trim values so as to apply a first predetermined number of program pulses to memory cells of a NAND memory array of the nonvolatile memory device;
  after performing the first program slice, send a second program instruction and a second set of trim values to the nonvolatile memory device while the nonvolatile memory device is in the test mode such that the second program instruction and the second set of trim values are stored in the trim registers;
  communicate with the nonvolatile memory device such that the nonvolatile memory device exits the test mode, the nonvolatile memory device operable upon exiting the test mode to perform a second program slice by executing the second program instruction using the second set of trim values so as to apply a second predetermined number of program pulses to the memory cells of the NAND memory array; and
  if one or more read command is pending at the nonvolatile memory controller when the first program slice is completed, perform the one or more pending read command prior to sending the second program instruction and the second set of trim values from the nonvolatile memory controller to the nonvolatile memory device.

8. The nonvolatile memory controller of claim 7 wherein the first set of trim values include one or more value that indicates the first predetermined number of program pulses and further wherein the second set of trim values include one or more value that indicates the second predetermined number of program pulses.

9. The nonvolatile memory controller of claim 8 wherein the second set of trim values include one or more value that indicates a programming step such that the last voltage step of the first slice is repeated during the second slice.

10. The nonvolatile memory controller of claim 8 wherein, when the one or more read command is pending at the nonvolatile memory controller when the first program slice is completed, the NAND shared algorithm circuit is further configured to:

perform a quality of service analysis;
perform the one or more pending read command if the quality of service analysis indicates that a program suspend is required to meet a quality of service criteria; and
not perform the one or more pending read command if the quality of service analysis indicates that a program suspend is not required to meet the quality of service criteria.

11. The nonvolatile memory controller of claim 7 wherein the NAND shared algorithm circuit is further configured to:
send a third program instruction and a third set of trim values to the nonvolatile memory device while the nonvolatile memory device is in a test mode such that the third program instruction and the third set of trim values are stored in trim registers of the nonvolatile memory device:
communicate with the nonvolatile memory device such that the nonvolatile memory device exits the test mode, the nonvolatile memory device operable upon exiting the test mode to perform a third program slice by executing the third program instruction using the third set of trim values so as to apply a third predetermined number of program pulses to the memory cells of the NAND memory array; and
if one or more additional read command is pending when the second program slice is completed, perform the one or more additional pending read command prior to sending the third program instruction and the third set of trim values from the nonvolatile memory controller to the nonvolatile memory device.

12. The nonvolatile memory controller of claim 11 wherein, when the one or more pending read command is performed prior to sending the second program instruction and the second set of trim values, the NAND shared algorithm circuit is configured to:
determine a suspend time;
determine whether a limit has been reached using the determined suspend time; and
when the limit has been reached, not performing the one or more additional pending read command prior to sending the third program instruction and the third set of trim values.

13. A nonvolatile memory system comprising:
a nonvolatile memory device including trim registers, a microcontroller and a NAND memory array, the microcontroller coupled to the trim registers and to the NAND memory array;
a nonvolatile memory controller configured to:
send a first program instruction and a first set of trim values to the nonvolatile memory device while the nonvolatile memory device is in a test mode such that the first program instruction and the first set of trim values are stored in the trim registers of the nonvolatile memory device;
communicate with the nonvolatile memory device such that the nonvolatile memory device exits the test mode, the nonvolatile memory device operable upon exiting the test mode to perform a first program slice by executing the first program instruction using the first set of trim values so as to apply a first predetermined number of program pulses to memory cells of the NAND memory array;
after performing the first program slice, send a second program instruction and a second set of trim values to the nonvolatile memory device while the nonvolatile memory device is in the test mode such that the second program instruction and the second set of trim values are stored in the trim registers;
communicate with the nonvolatile memory device such that the nonvolatile memory device exits the test mode, the nonvolatile memory device operable upon exiting the test mode to perform a second program slice by executing the second program instruction using the second set of trim values so as to apply a second predetermined number of program pulses to the memory cells of the NAND memory array; and
if one or more read command is pending at the nonvolatile memory controller when the first program slice is completed, perform the one or more pending read command prior to sending the second program instruction and the second set of trim values to the nonvolatile memory device.

14. The nonvolatile memory system of claim 13 wherein, when the one or more read command is pending at the nonvolatile memory controller when the first program slice is completed, the nonvolatile memory controller is further configured to:
perform a quality of service analysis;
perform the one or more pending read command if the quality of service analysis indicates that a program suspend is required to meet a quality of service criteria; and
not perform the one or more pending read command if the quality of service analysis indicates that a program suspend is not required to meet the quality of service criteria.

15. The nonvolatile memory system of claim 13 wherein the nonvolatile memory device is configured to:
send a third program instruction and a third set of trim values to the nonvolatile memory device while the nonvolatile memory device is in a test mode such that the third program instruction and the third set of trim values are stored in trim registers of the nonvolatile memory device;
communicate with the nonvolatile memory device such that the nonvolatile memory device exits the test mode, the nonvolatile memory device operable upon exiting the test mode to perform a third program slice by executing the third program instruction using the third set of trim values so as to apply a third predetermined number of program pulses to the memory cells of the NAND memory array; and
if one or more additional read command is pending when the second program slice is completed, perform the one or more additional pending read command prior to sending the third program instruction and the third set of trim values to the nonvolatile memory device.

16. The nonvolatile memory system of claim 13 wherein, when the one or more pending read command is performed prior to sending the second program instruction and the second set of trim values to the nonvolatile memory device, the NAND shared algorithm circuit is configured to:
determine a suspend time;
determine whether a limit has been reached using the determined suspend time; and
when the limit has been reached, not performing the one or more pending read command prior to sending the third program instruction and the third set of trim values to the nonvolatile memory device.

17. A method comprising:
initiating operation of a nonvolatile memory device that is not capable of performing a program suspend command;

sending a first program instruction and a first set of trim values from a nonvolatile memory controller to the nonvolatile memory device while the nonvolatile memory device is in a test mode such that the first program instruction and the first set of trim values are stored in the trim registers of the nonvolatile memory device;

exiting the test mode, the nonvolatile memory device operable upon exiting the test mode to execute the first program instruction using the first set of trim values so as to perform a first program operation on memory cells of a NAND memory array of the nonvolatile memory device;

when one or more read command for reading the nonvolatile memory device is pending at the nonvolatile memory controller at the end of the first program operation, sending an abort instruction from the nonvolatile memory controller to the nonvolatile memory device while the nonvolatile memory device is in the test mode such that the abort instruction is stored in the trim registers of the nonvolatile memory device;

in response to the abort instruction, aborting the first program operation;

determining a program time, wherein the determined program time corresponds to the time during which the first program operation was performed on the memory cells of the NAND memory array;

after the aborting, communicating with the nonvolatile memory device such that the nonvolatile memory device performs one or more read operation corresponding to the one or more pending read command;

sending a second program instruction and a second set of trim values from the nonvolatile memory controller to the nonvolatile memory device while the nonvolatile memory device is in the test mode such that the second program instruction and the second set of trim values are stored in the trim registers of the nonvolatile memory device; and exiting the test mode, the nonvolatile memory device operable upon exiting the test mode to execute the second program instruction using the second set of trim values so as to perform a second program operation on the memory cells of the NAND memory array, the second program operation beginning at a programming step corresponding to the determined program time.

18. The method of claim 17 wherein the second program operation begins at a programming step that is a repeat of a last programming step of the first program operation.

19. The method of claim 17 wherein communicating with the nonvolatile memory device such that the nonvolatile memory device performs one or more read operation corresponding to the one or more pending read command further comprises:

sending a read instruction and a third set of trim values from the nonvolatile memory controller to the nonvolatile memory device while the nonvolatile memory device is in the test mode such that the read instruction and the third set of trim values are stored in the trim registers of the nonvolatile memory device; and executing the read instruction at the nonvolatile memory device using the third set of trim values so as to perform the read operation.

20. The method of claim 17 wherein the program time is determined by monitoring a read/busy signal of the nonvolatile memory device.

* * * * *